US010224929B2

(12) United States Patent
Ishimatsu et al.

(10) Patent No.: US 10,224,929 B2
(45) Date of Patent: Mar. 5, 2019

(54) POWER SEMICONDUCTOR DRIVE CIRCUIT, POWER SEMICONDUCTOR CIRCUIT, AND POWER MODULE CIRCUIT DEVICE

(71) Applicant: Rohm Co., Ltd., Kyoto (JP)

(72) Inventors: Yuji Ishimatsu, Kyoto (JP); Motohiro Ando, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/646,826

(22) Filed: Jul. 11, 2017

(65) Prior Publication Data

US 2017/0310323 A1    Oct. 26, 2017

Related U.S. Application Data

(63) Continuation of application No. 14/877,057, filed on Oct. 7, 2015, now Pat. No. 9,729,150.

(30) Foreign Application Priority Data

Oct. 10, 2014   (JP) .................................. 2014-208662

(51) Int. Cl.
*H03K 19/00*   (2006.01)
*H03K 17/16*   (2006.01)

(52) U.S. Cl.
CPC ....... *H03K 19/0016* (2013.01); *H03K 17/162* (2013.01); *H03K 17/163* (2013.01)

(58) Field of Classification Search
CPC .................................................. H03K 19/0016
See application file for complete search history.

(56) References Cited

U.S. PATENT DOCUMENTS 5,450,019 A * 9/1995 McClure .......... H03K 19/00361
326/121
2015/0035569 A1   2/2015 Miura

FOREIGN PATENT DOCUMENTS

| JP | 2004-253582 | 9/2004 |
| JP | 2008-066929 | 3/2008 |
| JP | 2013-168905 | 8/2013 |

* cited by examiner

*Primary Examiner* — Daniel Puentes
(74) *Attorney, Agent, or Firm* — Fish & Richardson P.C.

(57) ABSTRACT

A power semiconductor drive circuit includes a parallel circuit connected to a gate of a power semiconductor element and constituted by two transistors for setting gate resistance of the power semiconductor element; a gate voltage monitoring circuit connected to the gate of the power semiconductor element and the parallel circuit, wherein a monitoring voltage is set in the gate voltage monitoring circuit to monitor a gate voltage of the power semiconductor element; a signal delay circuit to delay an output signal of the gate voltage monitoring circuit; and a gate control circuit to change the magnitude of combined resistance of the parallel circuit based on an output signal output from the signal delay circuit.

20 Claims, 11 Drawing Sheets

POWER SEMICONDUCTOR DRIVE CIRCUIT, POWER SEMICONDUCTOR CIRCUIT, AND POWER MODULE CIRCUIT DEVICE

CROSS-REFERENCE TO RELATED APPLICATION

This application is a continuation of U.S. patent application Ser. No. 14/877,057, filed Oct. 7, 2015, which is based upon and claims the benefit of priority from Japanese Patent Application No. 2014-208662, filed on Oct. 10, 2014, the entire contents of which are incorporated herein by reference.

TECHNICAL FIELD

The present disclosure relates to a power semiconductor drive circuit, a power semiconductor circuit using the power semiconductor drive circuit, and a power module circuit device including the power semiconductor circuit and other circuit devices mounted on a single assembly.

BACKGROUND

Power semiconductor elements may include, for example, IGBT (Insulated Gate Bipolar Transistor), power MOSTFET (Metal Oxide Semiconductor Field Effect Transistor), MOSGTO (MOS Gate Turn-off Thyristor) and the like. Further, an Intelligent Power Module (hereinafter referred to as an IPM) may include a power semiconductor circuit integrating these power semiconductor elements and a power semiconductor drive circuit for controlling gates of the power semiconductor elements, and circuit devices other than the power semiconductor circuit, which are packaged in a single package.

FIG. 11 schematically shows a power semiconductor drive circuit, a power semiconductor circuit and a power module circuit device. As shown in FIG. 11, drains D of transistors M2 and M3 are connected in common and this common connection point is connected to a node HO and a gate G of a transistor PT1. Gates G of transistors M2 and M3 are connected in common and an upper input signal HIN is applied to these common gates G via an upper driver UD. A power supply voltage VBB is applied to a source S of the transistor M2 via an external terminal VB. The power supply voltage VBB is a power supply voltage VCC supplied to an external terminal VC and a boost voltage generated in a bootstrap circuit BS. A source of the transistor M3 is connected to a node VS.

The transistor PT1 is referred to as an upper power transistor and a power supply voltage VPP is applied to a drain D of the transistor PT1 via an external terminal P. The gate G of the transistor PT1 is connected to the node HO. A source S of the transistor PT1 is connected to the node VS. A diode for free-wheeling (shown without a reference sign) is connected between the drain D and the source S of the transistor PT1.

A transistor PT2 is generally referred to as a lower power transistor and is fabricated on a separate semiconductor substrate from the transistor PT1 referred to as the upper power transistor. A wire LW made of material such as aluminum or copper is used as a connector for connecting the transistor PT1 and the transistor PT2. The wire LW has a first end connected to the node VS and a second end connected to an output terminal OUT and a drain D of the transistor PT2. The wire LW has an inductance component lw.

The drain D of the transistor PT2 is connected to the output terminal OUT, a source S of the transistor PT2 is connected to a ground electric potential GND via an external terminal N, and a lower input signal LIN is applied to a gate G of the transistor PT2. A diode for free-wheeling (shown without a reference sign) is connected between the drain D and the source S of the transistor PT2, like the transistor PT1. The transistor PT2 is turned on/off complementarily with the transistor PT1. That is, the transistor PT1 is OFF when the transistor PT2 is ON, and the transistor PT1 is ON when the transistor PT2 is OFF.

A capacitor CB for bootstrap is connected between the external terminal VC and the external terminal OUT. The external terminal OUT is connected to an external load. As the external load, an inductor L1 is shown. The inductor L1 directly indicates an inductor, for example, employed for a switching regulator, a motor winding, and a three-phase winding used for an inverter.

In the power semiconductor drive circuit and the like shown in FIG. 11, if a switching speed of the transistor PT1 is high, problems may occur where a transient voltage $\Delta V$ is generated by the inductance component lw of the wire LW and the transistors M2 and M3 deteriorate or are destroyed. In addition, if a switching speed of the transistor PT2 is high, gate capacitances Crss and Ciss of the transistor PT1 are charged and a gate voltage of the transistor PT1 exceeds a threshold voltage Vth of the transistor PT1. Accordingly, the transistor PT1 which should be originally placed in an OFF state is self-turned on and a through-current flows between the transistor PT1 and the transistor PT2, which may result in a problem of deterioration of the transistors PT1 and PT2. In addition, without leading to the deterioration, power may be wastefully consumed, which may result in difficulty in achieving power saving.

As a first solution to solve the above problems, the driving ability of a voltage-driven element may be lowered by changing a switching element of a parallel circuit when a gate voltage at the time of turning-on reaches a mirror voltage.

A second solution may include detecting a change in gate voltage by a comparing circuit and changing gate resistance based on the detection.

As a third solution to realize the compatibility of EMI noise suppression and switching loss suppression at low costs, a power device control circuit may employ a time constant circuit composed of a resistive element and a capacitor, as a timer circuit so as to equalize periods taken for a gate voltage to reach a mirror voltage.

However, the first solution still has a risk of a breakdown of a gate driver due to a surge or a transient voltage generated according to an operation of switching from an ON state to an OFF state.

The second solution requires a relatively complicated timer circuit for detecting a timing at which an element at a high electric potential side is switched from OFF to ON or from ON to OFF, and setting a predetermined voltage based on this detection.

Although the third solution suppresses the EMI noise, it cannot expect to suppress breakdown of a power semiconductor drive circuit and switching loss of a power semiconductor.

SUMMARY

According to one embodiment of the present disclosure, there is provided a power semiconductor drive circuit including: a parallel circuit which is connected to a gate of a power semiconductor element and is constituted by at least two transistors for setting gate resistance of the power semiconductor element; a gate voltage monitoring circuit connected to the gate of the power semiconductor element and the parallel circuit, wherein a predetermined monitoring voltage is set in the gate voltage monitoring circuit in order to monitor a gate voltage of the power semiconductor element; a signal delay circuit to delay an output signal of the gate voltage monitoring circuit; and a gate control circuit to change the magnitude of combined resistance of the parallel circuit based on an output signal output from the signal delay circuit.

The combined resistance of the parallel circuit may be changed when the power semiconductor element is turned off.

The monitoring voltage may be equal to or less than a mirror voltage of the power semiconductor element.

The combined resistance of the parallel circuit when the power semiconductor element is turned off may be larger than the combined resistance of the parallel circuit when the power semiconductor element is in an OFF state.

The combined resistance of the parallel circuit may be changed after a delay time set in the signal delay circuit elapses.

The ON state and OFF state of the gate voltage monitoring circuit may be controlled by a kill signal and an output signal of the gate voltage monitoring circuit may be a result of a logical AND operation for the kill signal and the gate voltage applied to the power semiconductor element.

The gate voltage monitoring circuit may be constituted by one or more selected from a group consisting of a Schmitt trigger, a hysteresis comparator, a window comparator, a comparator and an inverter.

The signal delay circuit may be an integration circuit including a resistor and a capacitor.

A predetermined threshold voltage may be set in the gate control circuit and the gate control circuit may output a result of a logical AND operation for a driving signal applied to the gate of the power semiconductor element and the output signal output from the signal delay circuit.

Assuming that a period from time t4, at which a mirror period of the gate voltage of the power semiconductor element is ended, to time t6, at which an output current flowing in the power semiconductor element is substantially zeroed, is $\tau1$ and a period from time t5, at which the gate voltage becomes equal to the monitoring voltage, to time t8, at which the gate voltage becomes equal to the threshold voltage, is $\tau2$, the condition of $\tau2 > \tau1$ may be set.

The power semiconductor element may include an upper power transistor connected to a power supply terminal and a lower power transistor connected to a ground electric potential, the upper power transistor being complementary to the lower power transistor, and assuming that a period from time t5, at which a gate voltage of the upper power transistor becomes equal to the monitoring voltage, to time t8 at which the gate voltage of the upper power transistor becomes equal to the threshold voltage, is $\tau2$ and time t 10 is a time at which the gate voltage of the upper power transistor when the lower power transistor is ON, becomes equal to the monitoring voltage, the relationship may be (t10−t5)>$\tau2$.

Assuming that a period from time t16, at which the gate voltage of the upper power transistor becomes equal to the monitoring voltage, to time t20, at which the upper power transistor begins to be turned off, is $\tau3$ and a period from time t16, at which the gate voltage of the upper power transistor becomes equal to the monitoring voltage, to time t18, at which the threshold voltage set in the gate control circuit becomes equal to the level of the output signal of the signal delay circuit, is $\tau4$, the condition of $\tau3 > \tau4$ may be set.

The gate control circuit may include a first transistor, a second transistor, an logical AND circuit, a first node, a second node, and a third node, wherein a gate of the first transistor and a first end of the logical AND circuit are connected to the first node, wherein a drain of the first transistor, a drain of the second transistor, and a second end of the logical AND circuit are connected to the second node, wherein an output terminal of the logical AND circuit and a gate of the second transistor are connected to the third node, and wherein the driving signal is applied to the first node and an output signal of the signal delay circuit is output to the second node.

According to another embodiment of the present disclosure, there is provided a power semiconductor circuit including: the above-described power semiconductor drive circuit; and a power semiconductor element having a gate driven by the power semiconductor drive circuit.

The power semiconductor element may be an MOS transistor or IGBT.

The power semiconductor element may be made of one selected from a group consisting of silicon (Si), silicon carbide (SiC), and gallium nitride (GaN).

The power semiconductor element may further include a diode, and wherein the diode is made of one selected from a group consisting of silicon (Si), silicon carbide (SiC), and gallium nitride (GaN).

The lower power transistor may be made of one selected from a group consisting of silicon (Si), silicon carbide (SiC), and gallium nitride (GaN).

The upper power transistor and the lower power transistor may be fabricated on separate semiconductor substrates, and wherein a drain-source conduction path of the upper power transistor and a drain-source conduction path of the lower power transistor are coupled in series between the power supply terminal and the ground electric potential.

The power semiconductor circuit may be used for one selected from a group consisting of inverters for converting DC into AC, one or more motor drive circuits, and switching power supply devices.

According to another embodiment of the present disclosure, there is provided a power module circuit device including: the above-described power semiconductor circuit; and at least one electronic element constituting at least a bootstrap circuit.

The power module circuit device may be packaged in a single dual-line package.

DETAILED DESCRIPTION

The present disclosure provides some embodiments of a power semiconductor drive circuit, a power semiconductor circuit, and a power module circuit device, which are capable of preventing gate driver breakdown caused by an induced voltage, a transient voltage or a jumping voltage generated by an inductance component of a wire according to a high-speed switching in a high-voltage and a large-current, particularly at the time of transition from an ON state to an OFF state, i.e., at the time of turn-off, and suppressing self-turning-on of a power transistor and switching loss.

First Embodiment

Figure 1:
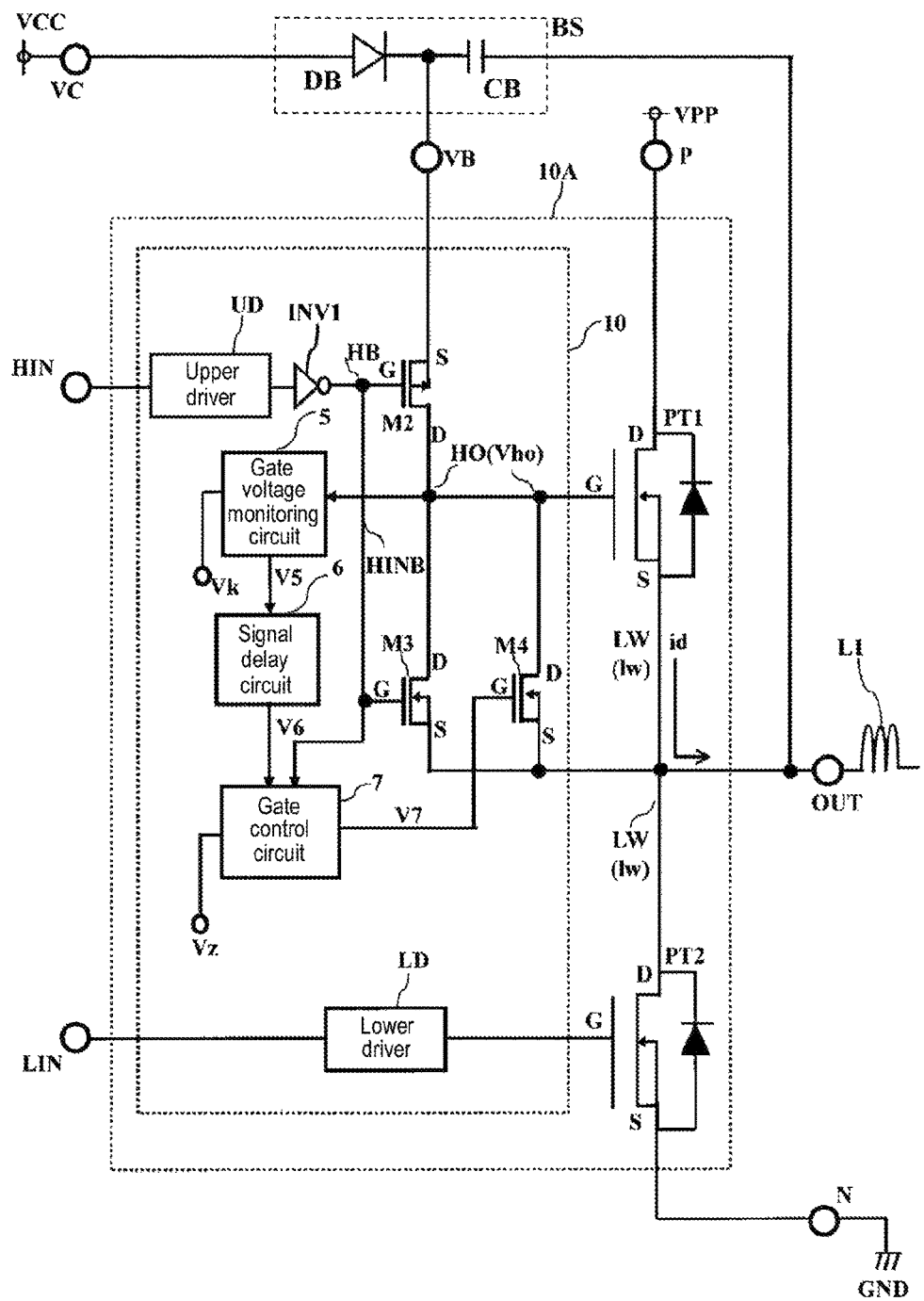
FIG. 1 is a circuit diagram showing a first embodiment of the present disclosure.

FIG. 1 shows a power semiconductor drive circuit, a power semiconductor circuit, and a power module circuit device according to the present disclosure. A power semiconductor circuit 10A includes a power semiconductor drive circuit 10 and a power module circuit device 100 includes the power semiconductor circuit 10A. In other words, the power semiconductor circuit 10A is constituted by the power semiconductor drive circuit 10 and transistors PT1 and PT2. In addition, the power module circuit device 100 is constituted by the power semiconductor circuit 10A and at least a bootstrap circuit BS. The power module circuit device 100 may be referred to as "IPM." For the bootstrap circuit BS, both of a diode DB and a capacitor CB may not be incorporated in the power module circuit device 100, but for example, only an electronic element of the diode DB may be incorporated therein and the capacitor CB may be disposed outside the power module circuit device 100. The bootstrap circuit BS may be constituted using electronic elements such as a resistor, a transistor, a switching element, a current source and the like, in addition to the diode and the capacitor.

The power module circuit device, i.e., IPM, may be generally considered as a single IC formed of a single package incorporating various types of ICs and discrete components such as a diode, a resistor, an inductor, a power transistor and the like, which are fabricated on a semiconductor substrate. In FIG. 1, the power semiconductor drive circuit 10 is constituted by one or more ICs fabricated on a semiconductor substrate. Gates G of the transistors PT1 and PT2 are controlled by the power semiconductor drive circuit 10. The transistors PT1 and PT2 are active elements fabricated on a separate semiconductor substrate from the power semiconductor drive circuit 10, as well as discrete components. Although it is shown in the embodiment of the present disclosure that the transistor PT1 and the transistor PT2 are formed on different semiconductor substrates, both transistors may be formed on the same semiconductor substrate. The diode and capacitor used for the bootstrap circuit BS are passive elements fabricated on a separate substrate from the power semiconductor drive circuit 10 and the transistors PT1 and PT2, as well as discrete components.

The power module circuit device 100 shown in FIG. 1 has external terminals, specifically, an external terminal VC as a first power supply terminal, an external terminal P as a second power supply terminal, an external terminal OUT as an output terminal, and an external terminal N as a ground terminal. The power module circuit device 100 further has an external terminal VB for supplying a boosted voltage in order to drive an upper driver UD. In addition to these external terminals, the power module circuit device 100 further has external terminals to which an upper input signal HIN and a lower input signal LIN supplied from an MCU (not shown) are input.

As described above, the power module circuit device 100 may be apparently considered as a single IC since it is formed of a single package incorporating ICs and other discrete components. The power module circuit device 100 is incorporated in a so-called dual-line package (DIP) with two opposing sides of the package on which external terminals are arranged. The power module circuit device 100 can be made compact by being packaged in the DIP. In addition, when the power module circuit device 100 is packaged in the DIP, sides on which the external terminals are not arranged can be effectively used as a wiring area.

The transistors PT1 and PT2 may employ, for example, power MOS transistors and IGBTs as power semiconductor elements. For example, a semiconductor substrate on which a power MOS transistor is fabricated may be formed of not only silicon (Si) but also, for example, silicon carbide (SiC) or gallium nitride (GaN).

Although the transistor PT1 and the transistor PT2 are prepared as power semiconductor elements, they have different roles in circuit operation. The transistor PT1 has the role to supply a load current to an inductor L1 serving as a load and the transistor PT2 takes responsibility for drawing a load current to be supplied to the inductor L1 from an upper power transistor, which is separate from the transistor PT1. As described previously, the transistors PT1 and PT2 are generally referred to as the upper power transistor and the lower power transistor, respectively. The term "upper" used herein means that the transistor PT1 is connected to the power supply terminal side and the term "lower" used herein means that the transistor PT2 is connected to the ground terminal side. Also, generally in the circuit diagram, when viewed from front, in many cases, the upper power transistor is disposed in the upper side and the lower power transistor is disposed in the lower side.

The transistors PT1 and PT2 shown in FIG. 1 are both formed of a conductivity type of NMOS transistor. A drain D of the transistor PT1 is connected to the external terminal P as the second power supply terminal and a source S of the transistor PT1 is connected to a drain D of the transistor PT2 with a common connection point therebetween connected to the output terminal OUT. A source S of the transistor PT2 is connected to a ground electric potential GND via the external terminal N. Alternatively, without being directly connected to the ground electric potential GND, the source S of the transistor PT2 may be connected to the ground electric potential GND via a current detection resistor. A gate G of the transistor PT2 is supplied with the lower input signal LIN via a lower driver LD. A diode for free-wheeling (shown without a reference sign) is formed between the drain D and the source S of each of the transistors PT1 and PT2. In general, the diode for free-wheeling may be a so-called parasitic diode which is parasitically formed in each of the transistors PT1 and PT2.

The transistors PT1 and PT2 operate in a complementary manner. That is, the polarity of a driving signal applied to the gate G of each of the transistors PT1 and PT2 is set in such a manner that the transistor PT2 is OFF when the transistor PT1 is on, and the transistor PT1 is OFF when the transistor PT2 is ON. In addition, so-called dead time for which both transistors are simultaneously off is set so that a through-current may not flow between the transistors PT1 and PT2 and both transistors may not deteriorate or be broken.

The source S of the transistor PT1 and the drain D of the transistor PT2 are connected in common and the common connection point therebetween is connected to the output terminal OUT. As described above, in the embodiment of the present disclosure, the source S of the transistor PT1 and the drain D of the transistor PT2 are connected by a wire LW made of material such as aluminum or copper. The wire LW has an inductance component lw. The output terminal OUT is coupled with, for example, an inverter for converting DC into AC, and for example, the inductor L1 such as a switching regulator or a three-phase winding of a three-phase motor. The inductor L1 may be broadly considered as an external load.

The power semiconductor drive circuit 10 is constituted by a single IC formed by integrating transistors M2, M3, and M4, a gate voltage monitoring circuit 5, a signal delay circuit 6, a gate control circuit 7, and so on.

The transistor M2 is a PMOS transistor and the transistor M3 and the transistor M4 are NMOS transistors. The transistor M2 and the transistor M3 play the role of a gate driver to drive the transistor PT1. For the transistors M3 and M4 both formed of the NMOS transistors, drain (D)-source (S) conduction paths of both transistors are connected in parallel with each other and are also connected in parallel to a gate (G)-source (S) conduction path of the transistor PT1. A parallel circuit constituted by at least two transistors including the transistors M3 and M4 sets a gate resistance when the transistor PT1 is off. Of course, in order to adjust the gate resistance, a resistor may be connected in series to the source S side or drain side D of at least one of the transistors M3 and M4. Combined resistance caused when the transistor M3 is ON and the transistor M4 is OFF is approximately equal to the ON resistance of the transistor M3. Combined resistance caused when the transistors M3 and M4 are simultaneously on corresponds to a parallel resistance of the ON resistances of the transistor M3 and the transistor M4. The combined resistance caused when the transistors M3 and M4 are simultaneously on is smaller than that caused when only the transistor M3 is on. In addition, in order to change the gate resistance when the transistor PT1 is OFF, a resistive element and a transistor may be connected in parallel or in series and the resistances of them may be changed in addition to the parallel circuit of the transistors M3 and M4.

The source S of the transistor M2 is connected to the external terminal VC as the first power supply terminal. The drain D of the transistor M2 is connected in common to the drain D of the transistor M3 and a common connection point HO therebetween is connected to the gate G of the transistor PT1. The gate G of the transistor M2 is connected in common to the gate G of the transistor M3, a common connection point HB therebetween is connected to an output of an inverter INV1, and an upper input signal HIN is input to an input of the inverter INV1 via an upper driver UD. The upper input signal HIN is a driving signal applied to the gate G of the transistor PT1.

The gate resistance when the transistor PT1 is OFF is greatly involved in switching characteristic and power consumption of the transistors PT1 and PT2, power consumption of the power semiconductor circuit 10A and the power module circuit device 100, and the breakdown voltage of the gate driver constituted by the transistors M2 and M3. Smaller gate resistance is disadvantageous to the breakdown voltage of the transistors M2 and M3, although it provides faster switching characteristics and less power consumption of the transistor PT1. On the other hand, larger gate resistance is advantageous to the breakdown voltage of the transistors M2 and M3, although it provides slower switching characteristics and more power consumption of the transistor PT1.

The gate voltage monitoring circuit 5 is connected to the common connection point HO, i.e., the gate G side of the transistor PT1. The gate voltage monitoring circuit 5 is turned on/off based on a predetermined monitoring voltage Vk set in the gate voltage monitoring circuit 5. Here, the monitoring voltage Vk is set to be equal to or less than a mirror voltage Vm generated in the mirror period of the transistor PT1. Setting the monitoring voltage Vk is one of many very important factors. This is because the magnitude of the monitoring voltage Vk is used to determine the switching timing of the gate resistance of the transistor PT1. If the monitoring voltage Vk is set to be more than the mirror voltage Vm, a change in current per time (di/dt) of the transistor PT1 is increased and there may be a problem caused in which a jumping voltage (an induced voltage or a transient voltage) caused by the inductance component lw of the wire LW exceeds the breakdown voltage of the transistors M2 and M3. The magnitude of the mirror voltage Vm and the length of the mirror period are varied depending on the kind of power semiconductor elements, conductivity type, size of transistor, and the like employed for the transistors PT1 and PT2. In addition, some variations may occur for the same conductivity type. Since the mirror voltage Vm may be varied depending on the configuration and implementation status of peripheral circuits and the operation conditions such as working temperature, there is a need to take a certain degree of margin on implementation.

An output signal V5 of the gate voltage monitoring circuit 5 is input to the signal delay circuit 6. The signal delay circuit 6 is provided to prevent a circuit at a subsequent stage from deviating from its inherent circuit operation due to noise components included in the output signal V5. In addition, the signal delay circuit 6 has the function to determine a delay time of signal transmission and ensures that when the transistor PT1 is transitioned from ON to OFF, the gate resistance of the transistor PT1 is changed after a drain-source current id (hereinafter referred to as an output current id) flowing between the drain and source of the transistor PT1 becomes zero.

An output signal V6 of the signal delay circuit 6 and an inverted signal HINB of the upper input signal HIN are input to the gate control circuit 7. An output signal V7 of the gate control circuit 7 is input to the gate G of the transistor M4 and turns on/off the transistor M4. For example, when the output signal V7 has a high level H and a low level L, the transistor M4 is tuned on and off, respectively.

The gate control circuit 7 also has the action to complement the circuit operation of the signal delay circuit 6, i.e., the function to further suppress and eliminate the noise components. In order to suppress and eliminate the noise components, a threshold voltage Vz is set in the gate control circuit 7. When the output signal V6 is less than the threshold voltage Vz, the output signal V7 becomes the high level H to turn on the transistor M4, thereby lowering the gate resistance caused when the transistor PT1 is OFF.

Although it is illustrated in the first embodiment that the gate voltage monitoring circuit 5, the signal delay circuit 6, the gate control circuit 7, and the transistor M4 are provided in the side of the transistor PT1 serving as the upper power transistor, they may be provided in the side of the transistor PT2 serving as the lower power transistor.

The power semiconductor drive circuit, the power semiconductor circuit, and the power module circuit device according to the present disclosure can be applied to inverters for converting DC into AC, drive circuits of various types of motors, switching power supply devices, and the like.

Second Embodiment

Figure 2:
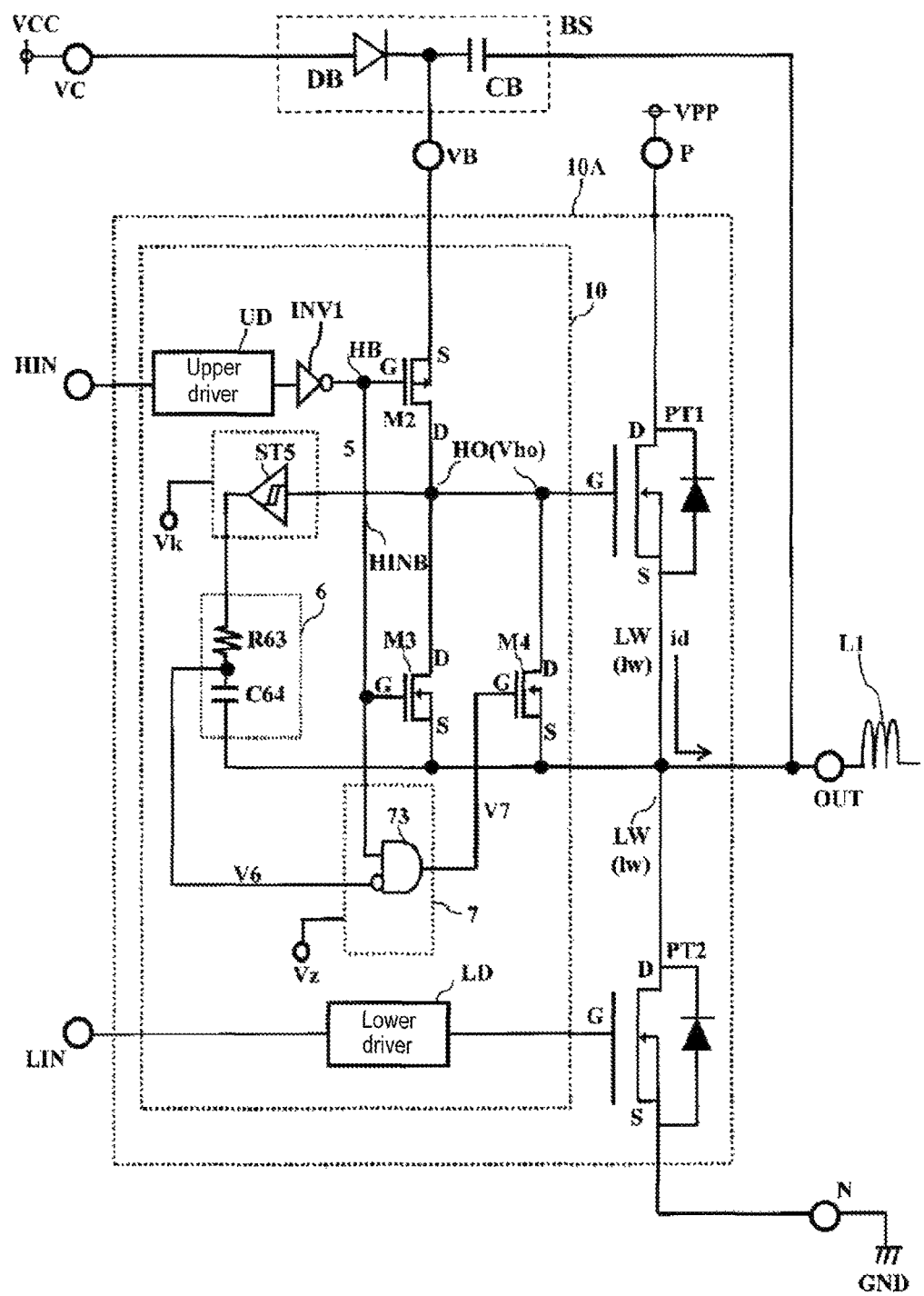
FIG. 2 is a circuit diagram showing a second embodiment of the present disclosure.

FIG. 2 shows a second embodiment of the present disclosure. FIG. 2 shows the internal circuits of the gate voltage monitoring circuit 5, the signal delay circuit 6, and the gate control circuit 7 shown in FIG. 1 (the first embodiment) in more detail. The same portions as FIG. 1 are denoted by the same reference numerals and explanation of which will not be repeated.

The gate voltage monitoring circuit 5 shown in FIG. 2 is constituted by a Schmitt trigger STS. The gate voltage monitoring circuit 5 may be constituted by one of a hysteresis comparator, a window comparator, a comparator and an inverter, or a combination of at least one of them and a logical OR circuit, a logical AND circuit, an inverting circuit, or other logic circuits, instead of the Schmitt trigger. In the same manner as described above, the monitoring voltage Vk is set to be equal to or less than the mirror voltage Vm of the transistor PT1 in the gate voltage monitoring circuit 5.

The signal delay circuit 6 is constituted by a resistor R63 and a capacitor C64. As described previously, the signal delay circuit 6 is provided to delay the output signal V5 output from the gate voltage monitoring circuit 5 in order to prevent a circuit at a subsequent stage from malfunctioning. In addition, since noise components such as an induced voltage, a transient voltage and a jumping voltage occur in the gate G of the transistor PT1 due to the switching of the transistor PT1 and the inductance component lw of the wire LW, the signal delay circuit 6 is very useful for suppression and elimination of these noise components and has the effect of significantly reducing risks of malfunction, deterioration, and destruction of the power module circuit device 100. In addition, since a signal delay time is determined by a combination of the resistance of the resistor R63 and the capacitance of the capacitor C64, it is ensured that when the transistor PT1 is transitioned from ON to OFF, the gate resistance of the transistor PT1 when the transistor PT1 is OFF is decreased after an output current id of the transistor PT1 becomes zero.

The gate control circuit 7 is constituted by a logical AND circuit 73. The logical AND circuit 73 is a circuit which outputs a result of a logical AND operation for the output signal V6 of the signal delay circuit 6 and the inverted signal HINB of the upper input signal HIN. The gate control circuit 7 can prevent the transistors M3 and M4 from being simultaneously transitioned when the upper input signal HIN is transitioned, thereby preventing the transistors M2 and M4 from being simultaneously ON. In addition, the Schmitt trigger may be provided in a subsequent stage of the logical AND circuit 73.

Figure 3:
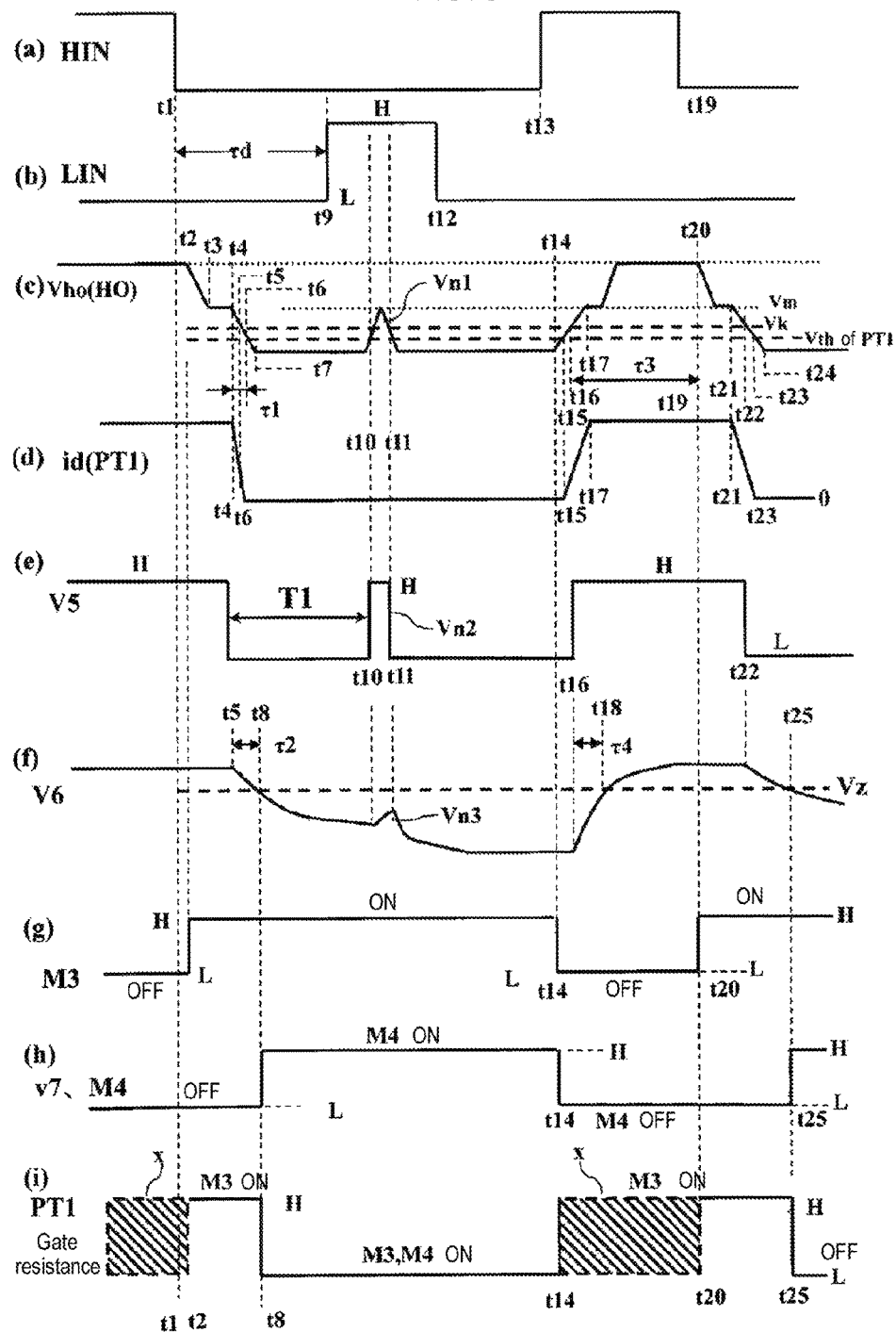
FIG. 3 is a time chart at the time when the circuits shown in FIGS. 1 and 2 are in normal operation.

FIG. 3 is a time chart according to the first and second embodiments shown in FIGS. 1 and 2. FIG. 3 is applied in common to FIGS. 1 and 2.

A graph of (a) of FIG. 3 shows the upper input signal HIN. The upper input signal HIN is applied to the transistors M2 and M3 and the gate control circuit 7 via the upper driver UD and the inverter INV1.

A graph of (b) of FIG. 3 shows the lower input signal LIN. The lower input signal LIN is applied to the gate G of the transistor PT2 via the lower driver LD. The lower input signal LIN is set to have, for example, a high level H when the upper input signal HIN has a low level L. There also exists a period during which the upper input signal HIN is set to have the low level L when the lower input signal LIN has the low level L. That is, a period for which both of the input signals have the low level L is provided. This period is a so-called dead time for which the transistors PT1 and PT2 are simultaneously OFF.

A graph of (c) of FIG. 3 shows a gate voltage Vho generated in the gate G of the transistor PT1 serving as the upper power transistor. The gate voltage Vho behaves responsive to the upper input signal HIN. At time t1, the upper input signal HIN is turned off. That is, although the upper input signal HIN is transitioned from the high level H to the low level L at time t1, the level of the gate voltage Vho begins to gradually fall from time t2 delayed a little from time t1. The level of the gate voltage Vho becomes substantially constant in a period from time t3 to time t4, which is referred to as a mirror period. A voltage level at which the magnitude of the gate voltage Vho is constant is generally referred to as a mirror voltage. When time t5 elapses after passing through time t4 of the mirror period, the gate voltage Vho is substantially 0V at time t7 through time t6 corresponding to a threshold voltage Vth. Time t5 indicates a time at which the gate voltage Vho reaches the monitoring voltage Vk set in the gate voltage monitoring circuit 5. Time t6 indicates a time at which the gate voltage Vho reaches a gate threshold voltage Vth of the transistor PT1. The duration from time t4 to time t6 is indicated by a period τ1. That is, the period τ1 corresponds to a relatively short period taken until the gate voltage Vho of the transistor PT1 reaches the gate threshold voltage Vth of the transistor PT1 after reaching the monitoring voltage Vk. In the period τ1, the transistor PT1 is in an ON state immediately before entering an OFF state.

After passing through time t7, the gate voltage Vho shows a state where a spike-like noise Vn1 occurs at a period from time t10 to time t11. Rather than the gate voltage Vho in the stationary state, the spike-like noise Vn1 is schematically shown to be superimposed on the gate voltage Vho. The noise component schematically shows a state where it occurs at a timing at which the transistor PT2 is ON, that is, in a period from time t10 to time t11 delayed a little from time t9 at which the lower input signal LIN shown in the graph of (b) of FIG. 3 becomes the high level H. When the lower input signal LIN is changed from the low level L to the high level H at time t9, if there is no signal delay, the transistor PT2 will enter an ON state at the same time as time t9. However, the transistor PT2 is actually ON after time t9 and it is shown that a period during which a noise exceeding the monitoring voltage Vk occurs in the gate of the transistor PT1 by the turning-on of the transistor PT2 is the period from t10 to time tn. Assuming that the signal delay time is zero, time t10 is the same as time t9. After passing through time t11, the gate voltage Vho of the transistor PT1 gradually rises at a timing at which the upper input signal HIN is transitioned from the low level L to the high level H, that is, from time t14 delayed a little from time t13 at which the upper input signal HIN is turned on. After passing through time t15 at which the output current id of the transistor PT1 is again flown and time t16 at which the gate voltage Vho reaches the monitoring voltage Vk set in the gate voltage monitoring circuit 5, the gate voltage Vho rises until time t17 at which the mirror period begins. Assuming that a timing at which the upper input signal HIN is again transitioned from the high level H to the low level L is time t19, the gate voltage Vho begins to fall again from time t20 delayed a little from time t19. The duration from time t16 to time t20 is indicated by a period τ3.

A graph of (d) of FIG. 3 shows the output current id flowing in the transistor PT1. The output current id is responsive to the gate voltage Vho shown in the graph of (c) of FIG. 3. Although maintained at maximum up to time t4 of the deep ON period (i.e., the mirror period) of the transistor PT1, the output current id is decreased in response to decreasing of the gate voltage Vho. When the gate voltage Vho falls below the gate threshold voltage Vth of the transistor PT1, the transistor PT1 approaches to an OFF state and ultimately, the output current id becomes about zero near time t7 at which the gate voltage Vho of the transistor PT1 becomes 0V.

A graph of (e) of FIG. 3 shows the output signal V5 of the gate voltage monitoring circuit 5. The output signal V5 has a high level H when the gate voltage Vho is higher than the monitoring voltage Vk set in the gate voltage monitoring circuit 5, and has a low level L when the gate voltage Vho is lower than the monitoring voltage Vk. Therefore, the output signal V5 has a high level H in periods from time t1 to time t5, time t10 to time t11, and time t16 to time t22, and has a low level L in periods from time t5 to time t10, time t11 to time t16 and after time t22. A period T1 shown in the graph of (e) of FIG. 3 indicates a period from time t5 at which the gate voltage monitoring circuit 5 begins to operate to time t10 at which a noise component Vn2 occurs. This period is also a period during which an integration circuit forming the signal delay circuit 6 to be described later is discharged.

A graph of (f) of FIG. 3 shows the output signal V6 of the signal delay circuit 6. The output signal V6 gradually falls from a falling timing of the output signal V5 shown in the graph of (e) of FIG. 3, i.e., time t5, toward time t14. The level of the output signal V6 is lowered since the integration circuit forming the signal delay circuit 6 continues to be gradually discharged until the upper input signal HIN is transitioned to the high level H, based on a time constant of the integration circuit. Although the output signal V6 rises slightly in a period from time t10 to time t11 by a noise Vn3 on the way, it again falls since the pulse width of the noise Vn3 is narrow.

The output signal V6 gradually falls even after it exceeds the threshold voltage Vz set in the gate control circuit 7. The duration from time t5 to time t8 at which the output signal V6 reaches the threshold voltage Vz is indicated by a period τ2. When the output signal V6 falls below the threshold voltage Vz, the gate control circuit 7 outputs an output signal V7 to turn on the transistor M4.

A circuit constant of the signal delay circuit 6 is set such that the period τ2 is larger than the period τ1 mentioned in the graph of (c) of FIG. 3, i.e., τ2>τ1. According to such condition setting, a timing at which the transistor M4 is transitioned from OFF to ON can be set after the output current id of the transistor PT1 is zeroed. In other words, the gate resistance when the transistor PT1 is OFF can be transitioned from a high level H (the ON resistance of the transistor M3) to a low level L (the parallel ON resistance of the transistors M3 and M4) after the output current id of the transistor PT1 is zeroed. This allows the di/dt value of the transistor PT1 to be reduced, thereby suppressing a transient voltage Δv caused by the inductance component lw of the wire LW and further suppressing breakdown voltage deterioration of the transistors M2 and M3.

Although the magnitude relationship between the period τ2 shown in the graph of (f) of FIG. 3 and the period τ1 shown in the graph of (c) of FIG. 3 is as described earlier, the relationship between the period τ2 and the period T1 is set to meet the condition of τ2<T1. The period T1 is the period from time t5 to time t10. That is, T1=t10−t5. Time t10 is a time at which the noise component Vn is assumed to occur. However, the noise components Vn1 to Vn3 may occur in the time t9 to t12 period during which the lower input signal LIN shown in the graph of (b) of FIG. 3 is transitioned from the low level L to the high level H. Therefore, also when the noise components Vn1 to Vn3 occur at time t9, the circuit constant of the signal delay circuit 6 has to be set to allow the signal delay circuit 6 to sufficiently suppress and attenuate the noise components Vn1 to Vn3 included in the output signal V5 input from the gate voltage monitoring circuit 5, so that the noise component Vn3 included in the output signal V6 output from the signal delay circuit 6 falls below the threshold voltage Vz. When this setting condition is satisfied, when the transistor PT2 is transitioned from OFF to ON (i.e., so-called turned ON) by the lower input signal LIN, it is possible to suppress excessive rising of the gate voltage of the transistor PT1 by dV/dt (change in voltage per time) of the transistor PT2 and further to eliminate the problem of the self-turn ON of the transistor PT1. The output signal V6 rises gradually from a rising timing of the output signal V5 shown in the graph of (e) of FIG. 3, i.e., time t16, toward time t22. A period from time t16 to time t18 at which the output signal V6 reaches the threshold voltage Vz is indicated by τ4. A time at which the output signal V6 has the same level as the threshold voltage Vz may not be time t18 but may be put between time t16 and time t17 which are earlier than time t18.

The circuit constant of the signal delay circuit 6 is set such that the period τ4 is smaller than the period τ3 shown in the graph of (e) of FIG. 3, i.e., τ3>τ4. In other words, assuming that a period from time t16 at which the gate voltage Vho of the transistor PT1 is equal to the monitoring voltage Vk to time t20 at which the transistor PT1 begins to be turned off is τ3 and a period from time t16 at which the gate voltage Vho of the transistor PT1 is equal to the monitoring voltage Vk to time t18 at which the threshold voltage Vz set in the gate control circuit 7 is equal to the level of the output signal V6 of the signal delay circuit 6 is τ4, the circuit constant of the signal delay circuit 6 is set to meet the relationship of τ3>τ4. According to such condition setting, when the transistor PT1 is transitioned to OFF, the transistor M4 is OFF, i.e., the gate resistance of the transistor PT1 is maintained at a high level H. In the same manner as described above, this allows the di/dt value of the transistor PT1 to be reduced, thereby suppressing a transient voltage Δv caused by the inductance component lw of the wire LW and the like and further suppressing breakdown voltage deterioration of the transistors M2 and M3.

A graph of (g) of FIG. 3 shows an ON/OFF state of the transistor M3 along with the gate voltage of the transistor M3. The gate voltage of the transistor M3 is substantially equal to an inversion (in polarity) of the upper input signal HIN. The gate voltage of the transistor M3 is transitioned from a low level L to a high level H at time t2 delayed a little from time t1 and is transitioned from the high level H to the low level L at time t14 delayed a little from time t13. The transistor M3 is ON in a period from time t2 to time t14.

A graph of (h) of FIG. 3 shows the output signal V7 of the gate control circuit 7. The output signal V7 is applied to the gate G of the transistor M4. The output signal V7 is an operation result of a logical AND operation for a voltage Vhb applied to the gate G of the transistor M3 and the output signal V6 output from the signal delay circuit 6. The output signal V7 has a low level L in a period from time t1 to time t8 and a high level H in a period from time t8 to time t14 and again has the low level L in a period from time t14 to time t25. The transistor M4 is ON when the output signal V7 has the high level H, while being OFF when the output signal V7 has the low level L. At time t14 delayed a little from time t13 at which the upper input signal HIN is turned on, since a signal of the node HB is input to a first end of the logical AND circuit 73 forming the gate control circuit 7, the logical AND circuit 73 outputs the output signal V7 having the low level L, irrespective of the output signal V6 of the signal delay circuit 6. That is, since it can be ensured that the transistor M4 and the transistor M3 are turned off substantially at the same time, it is possible to avoid simultaneous ON of the transistor M4 and the transistor M2.

A graph of (i) of FIG. 3 shows the gate resistance of the transistor PT1. Here, the gate resistance is a resistance interposed between the gate G and source S of the transistor PT1. When the transistor M3 is ON and the transistor M4 is OFF, the gate resistance is relatively high (H) since the ON resistance of the transistor M3 becomes the gate resistance. On the other hand, when both of the transistor M3 and the transistor M4 are ON, the gate resistance of the transistor PT1 is relatively low (L) since the parallel resistance of the transistors M3 and M4 becomes the gate resistance. The gate resistance of the transistor PT1 is maintained at a low level L when the transistor PT2 is ON. In a period x during which the transistors M3 and M4 are both OFF, only the transistor M2 is ON and accordingly the gate resistance when the transistor PT1 is OFF becomes high impedance.

Figure 4:
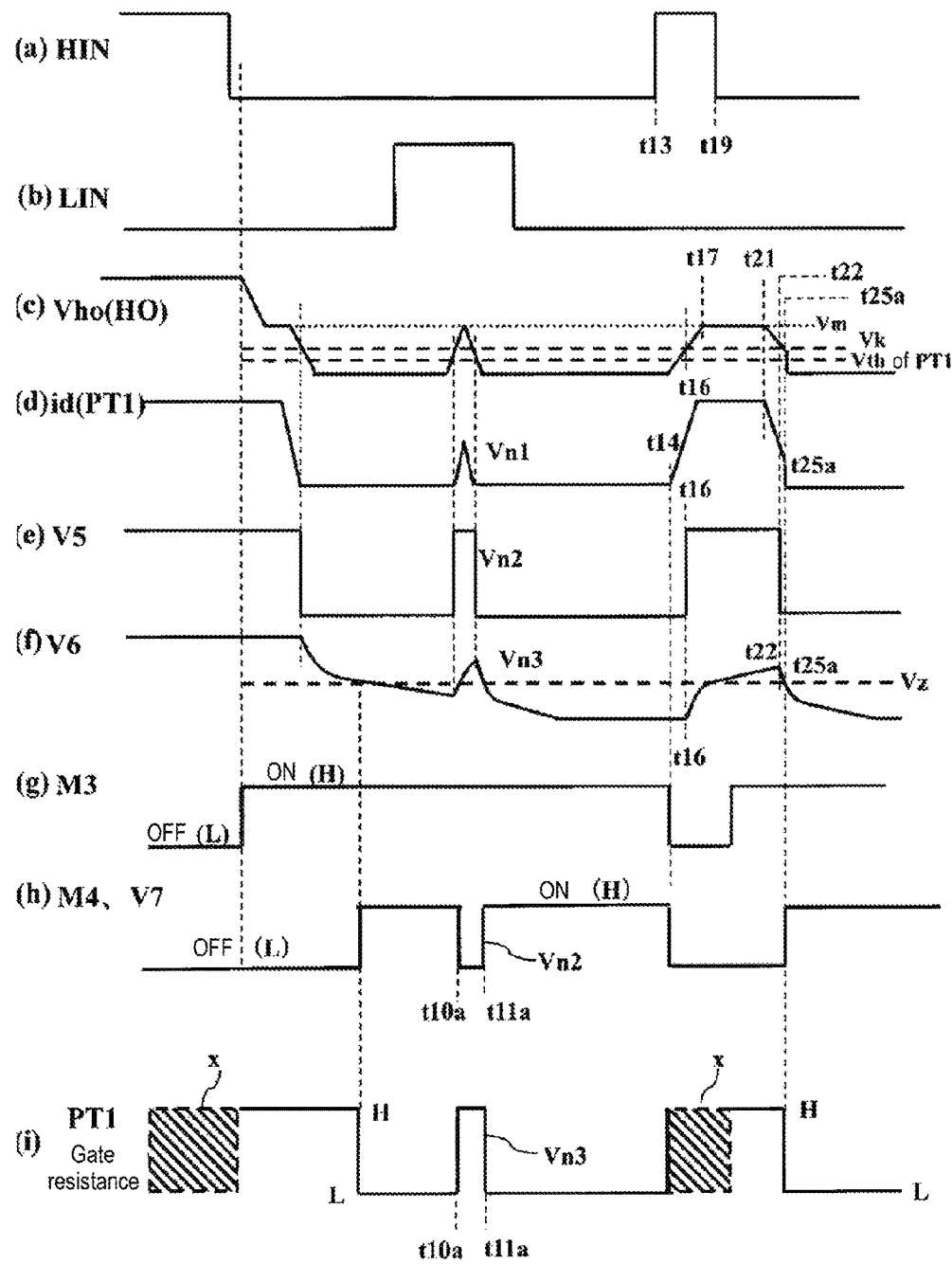
FIG. 4 is a time chart at the time when the circuits shown in FIGS. 1 and 2 deviate from normal operation.

FIG. 4 is a time chart in a case where the circuit constant of the signal delay circuit 6 in the second embodiment (FIG. 2) of the present disclosure is not properly set.

Graphs (a) to (e) and (g) of FIG. 4 are substantially the same as the graphs of (a) to (e) and (g) of FIG. 3, respectively, and therefore, explanation of which will not be repeated.

A graph of (f) of FIG. 4 shows the output signal V6 output from the signal delay circuit 6. It is schematically shown in this figure that the output signal V6 includes a noise component Vn3 which is still a larger level than the threshold voltage Vz of the gate control circuit 7 due to improper setting of the circuit constant of the signal delay circuit 6. A voltage value of the output signal V6 of the signal delay circuit 6 gradually rises a period from time t16 to time t22 during which the output signal V5 of the gate voltage monitoring circuit 5 has a high level H. If the boosting of the output signal V6 of the signal delay circuit 6 is not yet completed at time t22, a delay time from time t22 to time t25a at which the output signal V6 reaches the threshold voltage Vz is shortened and, therefore, the di/dt (change in current per time) value of the transistor PT1 is likely to increase, as shown in the graph of (c) of FIG. 4. It is advantageous to avoid the increase of the di/dt value from the view of the breakdown voltage of the transistors M2 and M3.

A graph of (h) of FIG. 4 shows the output signal V7 output from the gate control circuit 7. It is shown in this figure that the output signal V7 has a low level L in a period from time t10a to time t11a since the noise component Vn3 shown in the graph of (f) of FIG. 4 is larger than the threshold voltage Vz, although the output signal V7 should be originally at a high level H even in the period from time t10a to time t11a.

A graph of (i) of FIG. 4 schematically shows the magnitude of the gate resistance of the transistor PT1. When the gate voltage monitoring circuit 5, the signal delay circuit 6, and the gate control circuit 7 are operating in the normal mode, the gate resistance has a low level L even in the period from time t10a to time t11a. However, since the setting of the circuit constant of the signal delay circuit 6 is improper, the transistor M4 is placed in an OFF state in the period from time t10a to time t11a. This shows a state where the switching of the gate resistance of the transistor PT1 is not performed.

The above-described circuit configuration including the gate voltage monitoring circuit 5, the signal delay circuit 6, the gate control circuit 7, and the transistor M4 according to the present disclosure is suitable to switch the gate resistance at the time of turning-off of the transistor PT1 and ensure reduction of power loss and the breakdown voltage of the gate driver, i.e., the transistors M2 and M3. However, as described above, it should be noted that the original effect is reduced, particularly when the setting of the circuit constant of the signal delay circuit 6 is improper.

Third Embodiment

Figure 5:
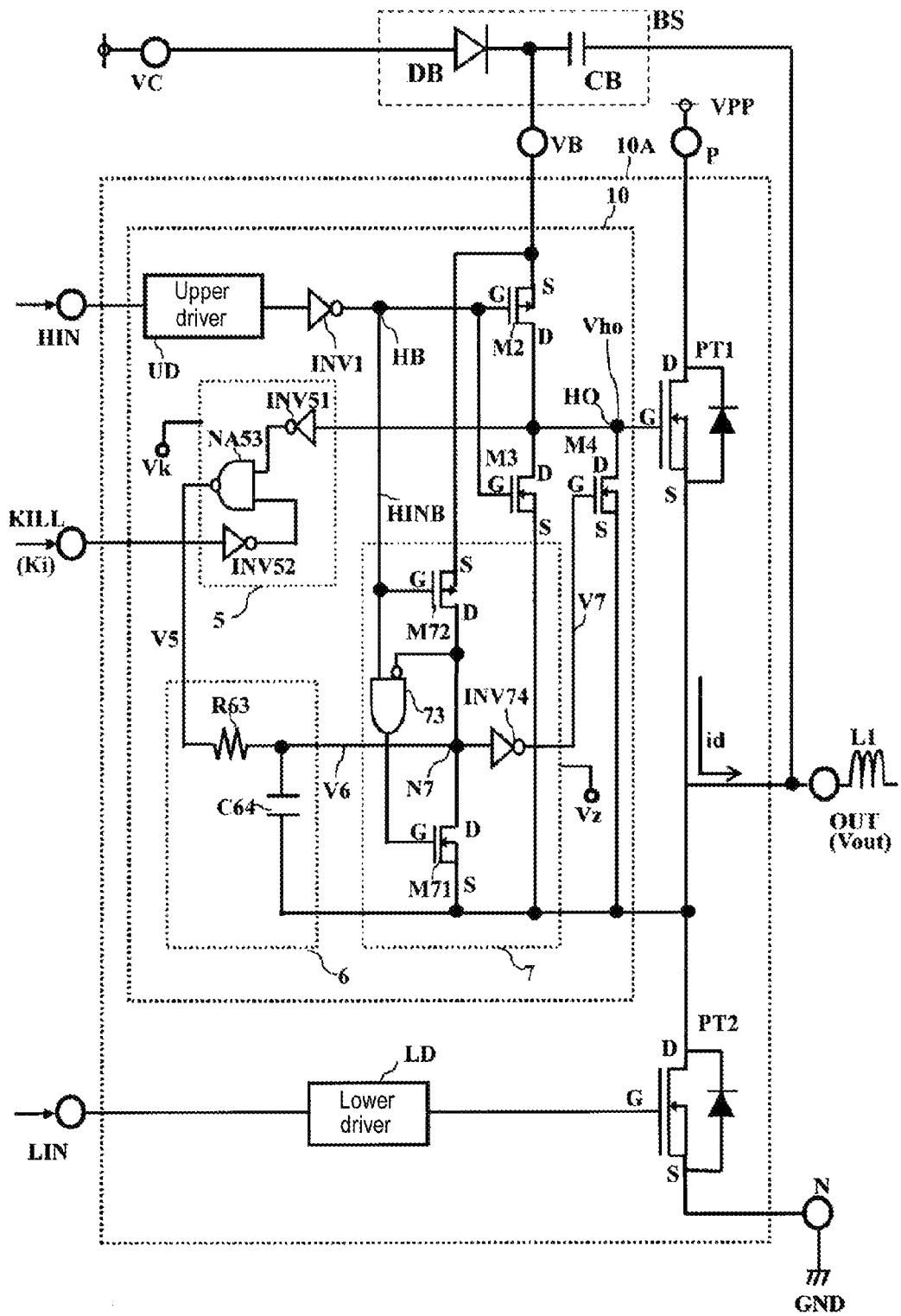
FIG. 5 is a circuit diagram showing a third embodiment of the present disclosure.

FIG. 5 shows a third embodiment of the present disclosure. FIG. 5 shows the gate voltage monitoring circuit 5 and the gate control circuit 7 shown in FIG. 2 (the second embodiment) in more detail. The same portions as FIGS. 1 and 2 are denoted by the same reference numerals and explanation of which will not be repeated.

In the third embodiment according to the present disclosure, the monitoring voltage Vk is set in the gate voltage monitoring circuit 5, and the monitoring voltage Vk is set to be equal to or less than the mirror voltage Vm of the transistor PT1. The gate voltage monitoring circuit 5 is connected to the gate G of the transistor PT1 and an external terminal KILL, respectively and outputs a result of a logical AND operation for the gate voltage Vho from the gate G of the transistor PT1 and a kill signal Ki applied to the external terminal KILL, as the output signal V5. The output signal V5 is input to the signal delay circuit 6.

The gate voltage monitoring circuit 5 includes inverters INV51 and INV52 and a logical NAND circuit NA53. An input of the inverter INV51 is connected to the gate G of the transistor PT1, i.e., the node HO, and an output of the inverter INV51 is connected to a first end of the logical NAND circuit NA53. The inverter INV51 is, for example, a CMOS inverter. The monitoring voltage Vk based on the switching characteristics of the inverter INV51 is set. The gate voltage Vho of the transistor PT1 is applied to the first end of the logical NAND circuit NA53 via the inverter INV51. An input of the inverter INV52 is connected to the external terminal KILL. The kill signal Ki is applied to the external terminal KILL. The kill signal Ki is set to a high level H or a low level L. In this embodiment of the present disclosure, when the kill signal Ki has the low level L, the gate voltage monitoring circuit 5 operates in the normal mode and the signal delay circuit 6 and the gate control circuit 7 coupled to the subsequent stage of the gate voltage monitoring circuit 5 also operate in the normal mode. When the kill signal Ki is set to the high level H, the circuit operation of the gate voltage monitoring circuit 5 is interrupted and stopped. At this time, the signal delay circuit 6 and the gate control circuit 7 at the subsequent stage are also interrupted and stopped.

The effect of the circuit operation of the gate voltage monitoring circuit 5, the signal delay circuit 6, and the gate control circuit 7 can be determined from a comparison between an output signal waveform and an output current waveform of the external terminal OUT provided as an output terminal when the kill signal Ki is set to the low level L and the high level H.

The signal delay circuit 6 shown in FIG. 5 is constituted by the same resistor R63 and capacitor C64 as the second embodiment (FIG. 2). The resistor R63 and the capacitor C64 form an integration circuit, i.e., a low pass filter. This low pass filter may be composed of not only one stage but also a plurality of stages. The signal delay circuit 6 shows the effect of suppressing and eliminating noise components Vn1 and Vn2 included in the output signal V5.

The gate control circuit 7 is composed of an NMOS transistor M71, a PMOS transistor M72, a logical AND circuit 73, and an inverter INV74, unlike the second embodiment (FIG. 2).

In the gate control circuit 7, the transistors M71 and M72 are connected in series via a node N7. A gate G of the transistor M72 is connected to the node HB and a first end of the logical AND circuit 73. A drain D of the transistor M72 is connected to a second end of the logical AND circuit 73, a drain D of the transistor M71, and the node N7. An input of the inverter INV74 is connected to the node N7 and an output of the inverter INV74 is connected to the gate of the transistor M4 provided to change the gate resistance of the transistor PT1. The inverter INV74 is, for example, a CMOS inverter. The threshold voltage Vz based on the switching characteristics of the CMOS inverter is set. An output of the logical AND circuit 73 is connected to the gate G of the transistor M71. The node N7 is connected to an output of the signal delay circuit 6, i.e., the common connection point between the resistor R63 and the capacitor C64. The transistor M72 and the transistor M71 may be regarded as a CMOS inverter connected in series between the external terminal VB as a boot terminal and the external terminal OUT as an output terminal, and the node N7 may be regarded as an output terminal of the CMOS inverter. Therefore, an output signal of the signal delay circuit 6 outputting the output signal V6 is a signal obtained by adding the output of the CMOS inverter and the output of the signal delay circuit 6. In other words, the output signal V6 is controlled by the CMOS inverter.

Figure 6:
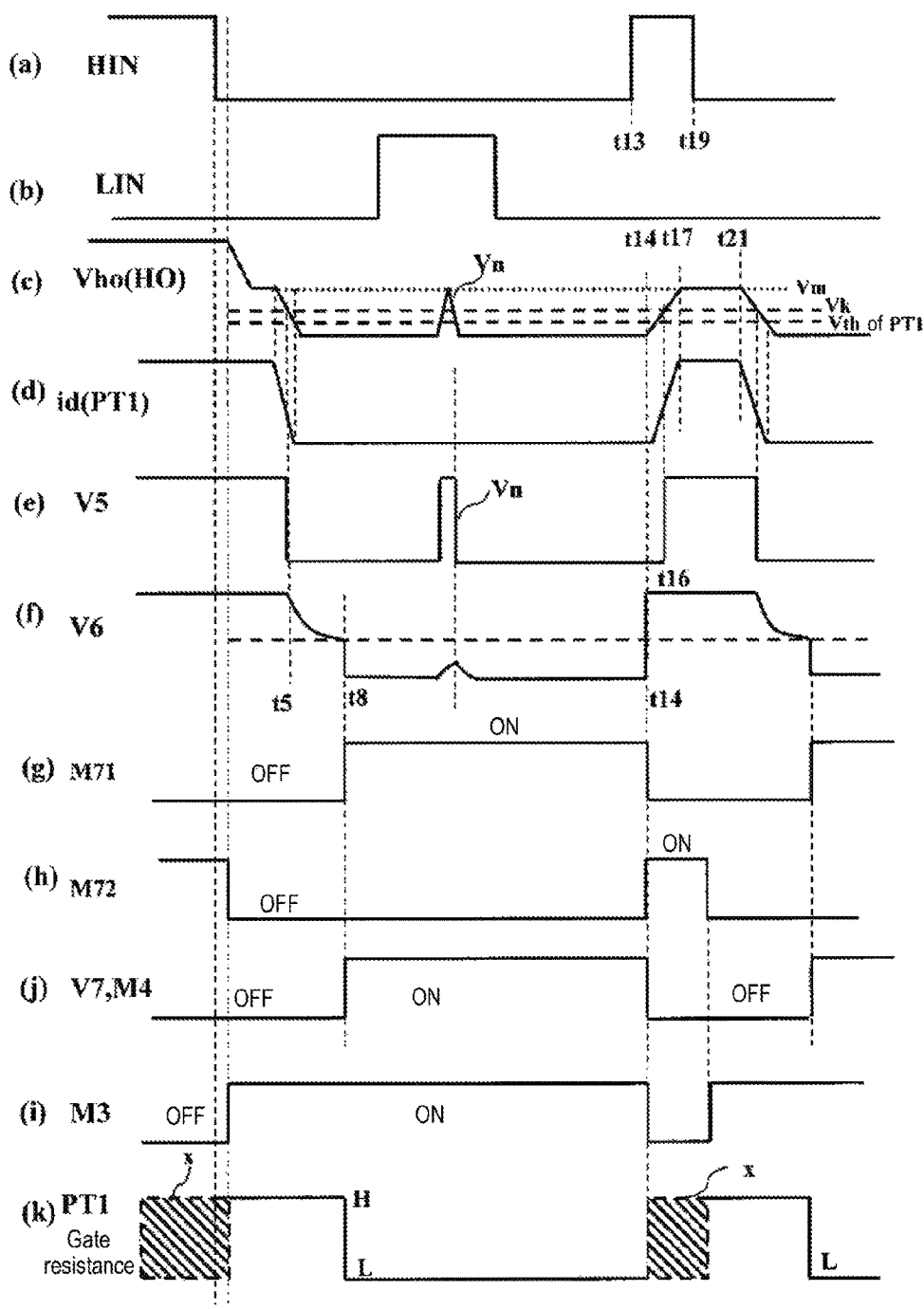
FIG. 6 is a time chart of the third embodiment.

FIG. 6 is a time chart of the third embodiment. FIG. 6 is similar as FIG. 3 except the following points. First, a voltage waveform of a graph of (f) of FIG. 6 is different from that of the graph of (f) of FIG. 3. Second, a graph of (g) of FIG. 6 shows an ON/OFF state of the transistor M71. Third, a graph of (h) of FIG. 6 shows an ON/OFF state of the transistor M72. FIG. 6 shows signal waveforms obtained when the external terminal KILL as the killer terminal shown in FIG. 5 is set to a low level L and the gate voltage monitoring circuit 5, the signal delay circuit 6 and the gate control circuit 7 are operated in the normal mode.

FIG. 6 is mostly the same as FIG. 3 described previously and therefore, explanation about the same portions will not be repeated. The graphs of (f), (g), and (h) of FIG. 6 will be described below.

The graph of (f) of FIG. 6 shows an output signal V6 output from the signal delay circuit 6. The output signal V6 is sharply turned to a low level L at time t8, and the low level L lasts to time t14. This property is very different from that in the period from time t8 to time t14 shown in the graph of (f) of FIG. 3. This is because the property in the period from time t8 to time t14 is determined by the characteristics of the CMOS inverter composed of the transistors M71 and M72 shown in FIG. 5. As described above, at time t8, the output signal V6 of the signal delay circuit 6 reaches the threshold voltage Vz of the gate control circuit 7, a high level H of the output signal of the logical AND circuit 73 is applied to the gate G of the transistor M71, and the transistor M71 is accordingly turned on. At this time, the capacitor C64 of the signal delay circuit 6 becomes short-circuited and the output signal V6 of the signal delay circuit 6 is sharply turned to a low level L. That is, the CMOS inverter is used at time t8 to separate the switching of the gate resistance at the time of turning-off of the transistor PT1 from the characteristics of the signal delay circuit 6.

At time t14 delayed a little from time t13 at which the upper input signal HIN is turned on, since the transistor M72 of the CMOS inverter goes to an ON state and the transistor M71 goes to an OFF state, an electric potential difference across the two ends of the transistor M71 is directly applied across the two ends of the capacitor C64. Therefore, the capacitor C64 is rapidly charged and the output signal V6 of the signal delay circuit 6 is sharply turned to a high level H, thereby eliminating a need of the above-mentioned condition of $\tau 3 > \tau 4$.

A graph of (g) of FIG. 6 shows an ON/OFF state of the transistor M71. The ON period of the transistor M71 corresponds to a period from time t8 to time t14. The period of low level L of the output signal V6 is substantially equal to the ON period of the transistor M71.

A graph of (h) of FIG. 6 shows an ON/OFF state of the transistor M72. The ON/OFF of the transistor M72 is responsive to the high level H and low level L of the upper input signal HIN. That is, the transistor M72 is ON when the upper input signal HIN has the high level H, while being OFF when the upper input signal HIN has the low level L.

Figure 7:
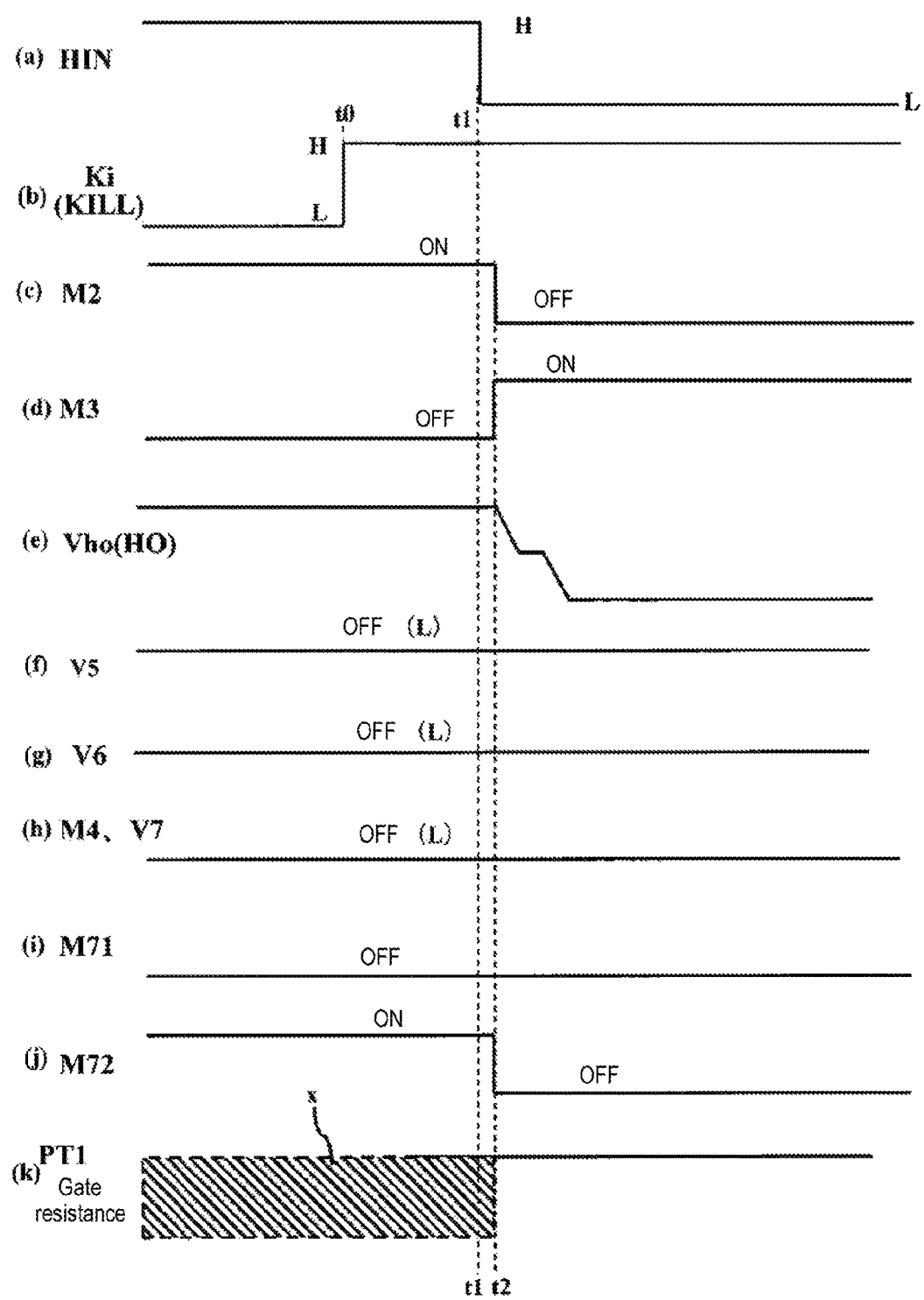
FIG. 7 is a time chart at the time of checking the operation shown in FIG. 6.

FIG. 7 shows a time chart when the external terminal KILL in the third embodiment shown in FIG. 5 is set to a high level H, the gate voltage monitoring circuit 5, the signal delay circuit 6, and the gate control circuit 7 are interrupted and stopped, and the transistor M4 is OFF in order to check the extent of effects by a difference in magnitude of the gate resistance of the transistor PT1.

A graph of (a) of FIG. 7 shows the upper input signal HIN. It is here shown that the upper input signal HIN is transitioned from a high level H to a low level L at time t1.

A graph of (b) of FIG. 7 shows the kill signal Ki applied to the external terminal KILL. The kill signal Ki is set to be transitioned from a low level L to a high level H at time t0 earlier than time t1. In the embodiment of the present disclosure, the check function to check the magnitude of the gate resistance of the transistor PT1 according to the present disclosure is performed when the kill signal Ki has the high level H, while the check function is being interrupted when the kill signal Ki has the low level L. Therefore, when the check function is performed, the switching of the kill signal Ki is prioritized to the switching of other signals or voltages. If the switching of the kill signal Ki from the low level L to the high level H is delayed from time t1, sufficient effects of the present disclosure cannot be expected.

When the kill signal Ki is switched from the low level L to the high level H at time to, the gate voltage monitoring circuit 5, the signal delay circuit 6, and the gate control circuit 7 are interrupted and stopped by being separated from the normal mode after time t1.

A graph of (c) of FIG. 7 shows an ON/OFF state of the transistor M2. The transistor M2 operates in response to the upper input signal HIN shown in the graph of (a) of FIG. 7.

When the upper input signal HIN has a high level H and a low level L, the transistor M2 is ON and OFF, respectively.

A graph of (d) of FIG. 7 shows an ON/OFF state of the transistor M3. The transistor M3 operates in response to the upper input signal HIN shown in the graph of (a) of FIG. 7. When the upper input signal HIN has the high level H and the low level L, the transistor M3 is OFF and ON, respectively. The ON/OFF state of the transistor M3 is complementary to that of the transistor M2 shown in the graph of (c) of FIG. 7 from a difference in circuit configuration and conductivity type of the transistor. Therefore, the transistor M3 is ON when the transistor M2 is OFF, and the transistor M3 is OFF when the transistor M2 is ON.

A graph of (e) of FIG. 7 shows the gate voltage Vho of the transistor PT1, i.e., the voltage of the node HO. The gate voltage Vho is responsive to the turning-ON/OFF of the transistor M2 without being affected by the kill signal Ki shown in the graph of (b) of FIG. 7. As shown in FIGS. 3 and 6 described previously, the gate voltage Vho gradually falls from time t2 toward time t3, maintains at approximately a constant mirror voltage Vm in the mirror period from time t3 to time t4, and begins to further fall toward time t7 after passing through the mirror period.

A graph of (f) of FIG. 7 shows the output signal V5 of the gate voltage monitoring circuit 5. After time t0, the operation of the gate voltage monitoring circuit 5 remains interrupted and stopped by the kill signal Ki, and therefore, the output signal V5 has a low level L. In addition, before time t0, the gate voltage monitoring circuit 5 is in the normal mode since the kill signal Ki has the low level L, but the output signal V5 has the low level L as well since this signal is in the dead time period during which the transistors PT1 and PT2 are both OFF. A graph of (g) of FIG. 7 shows the output signal V6 of the signal delay circuit 6. Since no signal from the gate voltage monitoring circuit 5 at the previous stage exist, the output signal V6 has a low level L like the output signal V5 in the signal delay circuit 6.

A graph of (h) of FIG. 7 shows the output signal V7 of the gate control circuit 7. The output signal V7 is applied to the gate G of the transistor M4. The output signal V7 is generated based on the output signal V6 output from the signal delay circuit 6. Therefore, the output signal V7 has a low level L, like the output signal V6. At this time, the transistor M4 is placed in the OFF state.

A graph of (i) of FIG. 7 shows an ON/OFF state of the transistor M71 constituting the gate control circuit 7. The transistor M71 is turned on/off by the output signal of the logical AND circuit 73. Since the transistor M71 is an NMOS transistor, the ON/OFF of the transistor M71 is responsive to the gate voltage applied to the gate G thereof. That is, the transistor M71 is ON when the gate voltage of the transistor M71 has a high level H, while being OFF when the gate voltage has a low level L.

A graph of (j) of FIG. 7 shows an ON/OFF state of the transistor M72. An inversion signal HINB of the upper input signal HIN is applied to the gate G of the transistor M72. Therefore, the ON/OFF of the transistor M72 is responsive to the upper input signal HIN shown in the graph of (a) of FIG. 7. That is, when the upper input signal HIN has the high level H and the low level L, the transistor M72 is ON and OFF, respectively.

A graph of (k) of FIG. 7 shows whether the gate resistance of the transistor PT1 has a high level H or a low level L. When the transistor M3 is ON and the transistor M4 is OFF, the gate resistance of the transistor PT1 has a high level H which is approximately equal to the ON resistance of the transistor M3. When the transistors M3 and M4 are both ON, the gate resistance of the transistor PT1 has a low level L. However, FIG. 7 shows the operations of a state where the gate voltage monitoring circuit 5, the signal delay circuit 6 and the gate control circuit 7 are interrupted and stopped by the kill signal Ki, in which there exists no period during which the gate resistance of the transistor PT1 is fixed at the low level L. Since a period x indicated with oblique lines is the dead time of the transistors PT1 and PT2 as well as a period during which the kill signal Ki is applied, the gate resistance at the time of turning-off of the transistor PT1 becomes high impedance.

Figure 8:
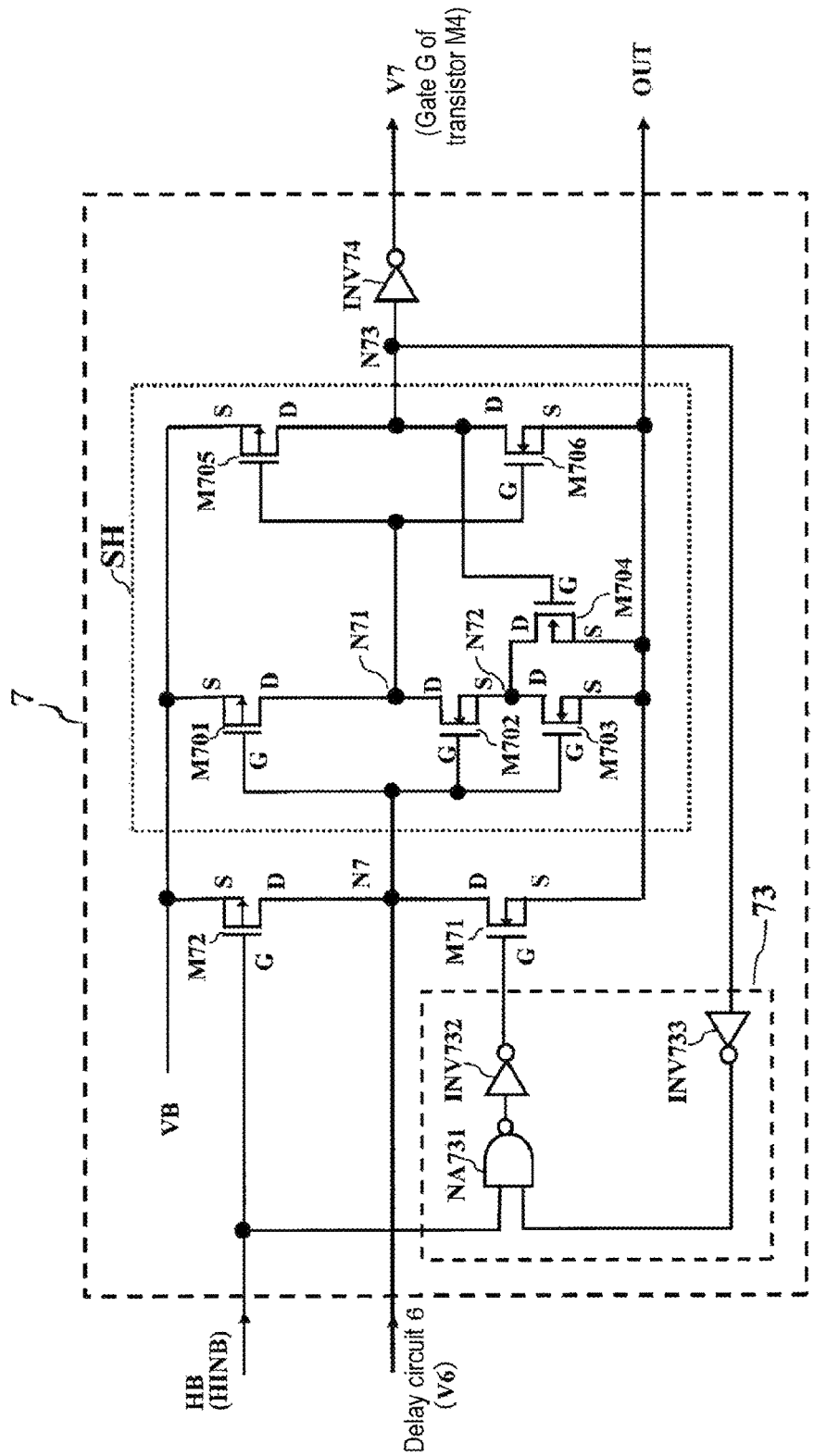
FIG. 8 is a detailed circuit diagram of the gate control circuit 7 used in FIG. 6.

FIG. 8 shows a modification of the gate control circuit 7 used for the third embodiment (FIG. 5). The gate control circuit 7 shown in FIG. 8 differs greatly from that shown in FIG. 5 in that a Schmitt trigger SH is connected between the node N7 and an input terminal of the inverter 74.

In general, a Schmitt trigger has two threshold values for an input signal and is widely used to avoid a malfunction which may be caused by a noise component included in the input signal. The Schmitt trigger SH shown in FIG. 8 includes transistors M701, M702, M703, M704, M705, and M706. A conductivity type of the transistors M701 and M705 is PMOS and a conductivity type of the transistors M702, M703, M704, and M706 is NMOS.

A source S of the transistor M701 is connected to a power supply terminal VB. Drains D of the transistors M701 and M702 are connected in common and the common connection point thereof is indicated by the node N71. Gates G of the transistors M701 and M702 are connected in common to the node N7. The output signal V6 output from the signal delay circuit 6 is applied to the node N7. A source S of the transistor M702 is connected to a drain D of the transistor M703. A common connection point between the drain D of the transistor M703 and the source S of the transistor M702 is indicated by a node N72. A source S of the transistor M703 is connected to a ground electric potential GND and a gate G thereof is connected in common to the gate G of the transistor M702.

Gates G of the transistors M705 and M706 are connected in common to the node N71 to which the drains D of the transistors M701 and M702 are connected in common. A source S of the transistor M705 is connected to the external terminal VC as a first power supply terminal and a drain D thereof is connected to a drain D of the transistor M706. The common connection point between the drains D of the transistors M705 and M706 is indicated by a node N73. A source S of the transistor M706 is connected to the ground electric potential GND. The transistor M705 and the transistor M706 form a CMOS inverter.

A gate G of the transistor M704 is connected to the node N73. Two threshold values of the Schmitt trigger SH are set based on the ON resistance of each of the transistors M701, M702, M703, and M704. The ON resistance of each of the transistors M701, M702, M703, and M704 may be determined to set appropriate channel width and channel length of each transistor.

In addition, an input of the inverter INV74 is connected to the node N73 and an output of the inverter INV74 is applied, as the output signal V7 of the gate control circuit 7, to the gate G of the transistor M4.

Although the Schmitt trigger SH shown in FIG. 8 is employed for the gate control circuit 7, this may be used for the gate voltage monitoring circuit 5.

Figure 9:
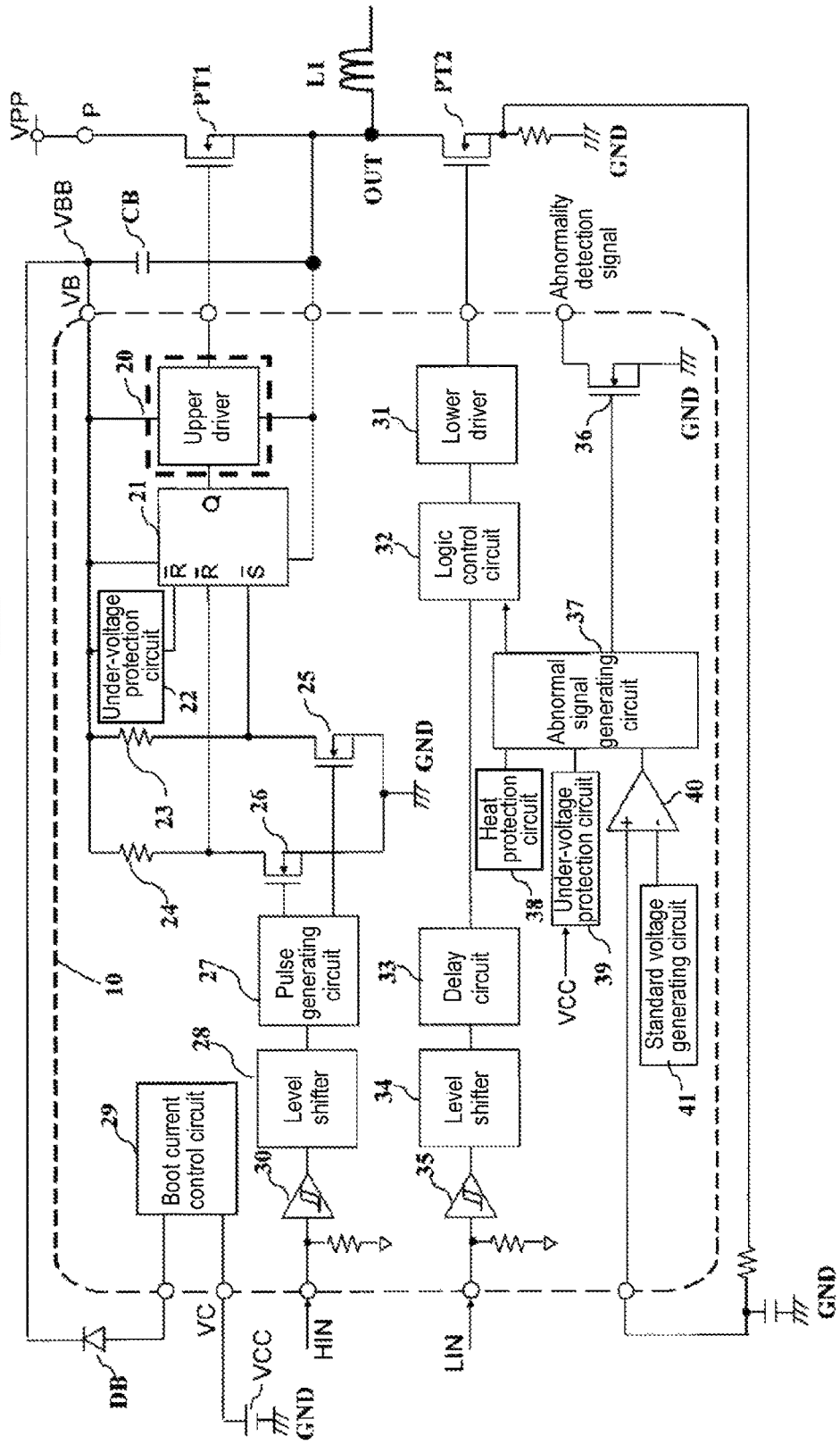
FIG. 9 is a circuit diagram showing one example of a power semiconductor module circuit device according to the present disclosure.

FIG. 9 is a circuit diagram showing a power module circuit device (IPM) 100A applied to the present disclosure and conventional techniques. The power module circuit device 100A includes an upper driver 20. The upper driver 20 includes the power semiconductor drive circuit 10 shown in FIGS. 1, 2, and 5 according to the present disclosure. The power module circuit device 100A further includes an RS flip-flop circuit 21, a under-voltage protection circuit 22, resistors 23 and 24, NMOS transistors 25 and 26, a pulse generating circuit 27, a level shifter 28, a boot current control circuit 29, a Schmitt trigger 30, a lower driver 31, a logic control circuit 32, a signal delay circuit 33, a level shifter 34, a Schmitt trigger 35, an NMOS transistor 36, an abnormal signal generating circuit 37, a heat protection circuit 38, a under-voltage protection circuit 39, a comparator 40 and a standard voltage generating circuit 41. An external terminal KILL for applying a kill signal Ki is not shown in the power module circuit device shown in FIG. 9.

The power module circuit device 100A shown in FIG. 9 further includes a capacitor CB and a diode DB. The capacitor CB and the diode DB form a bootstrap circuit. A boot voltage VBB generated at a common connection point between the capacitor CB and the diode DB is used as a power supply voltage for driving the upper driver 20 and so on via the external terminal VB. The power module circuit device 100A is packaged in a DIP.

Figure 10:
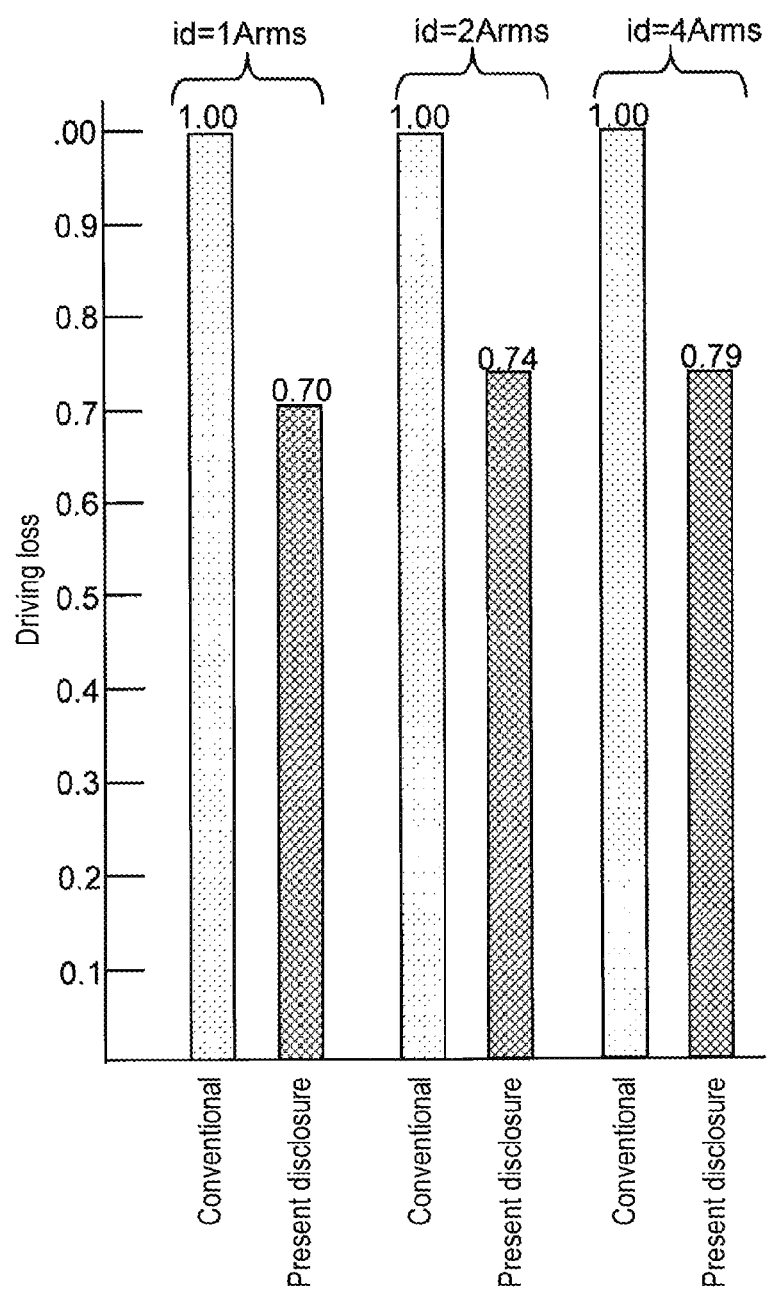
FIG. 10 is a figure showing a comparison in driving loss between the present disclosure and the conventional technique.
Figure 11:
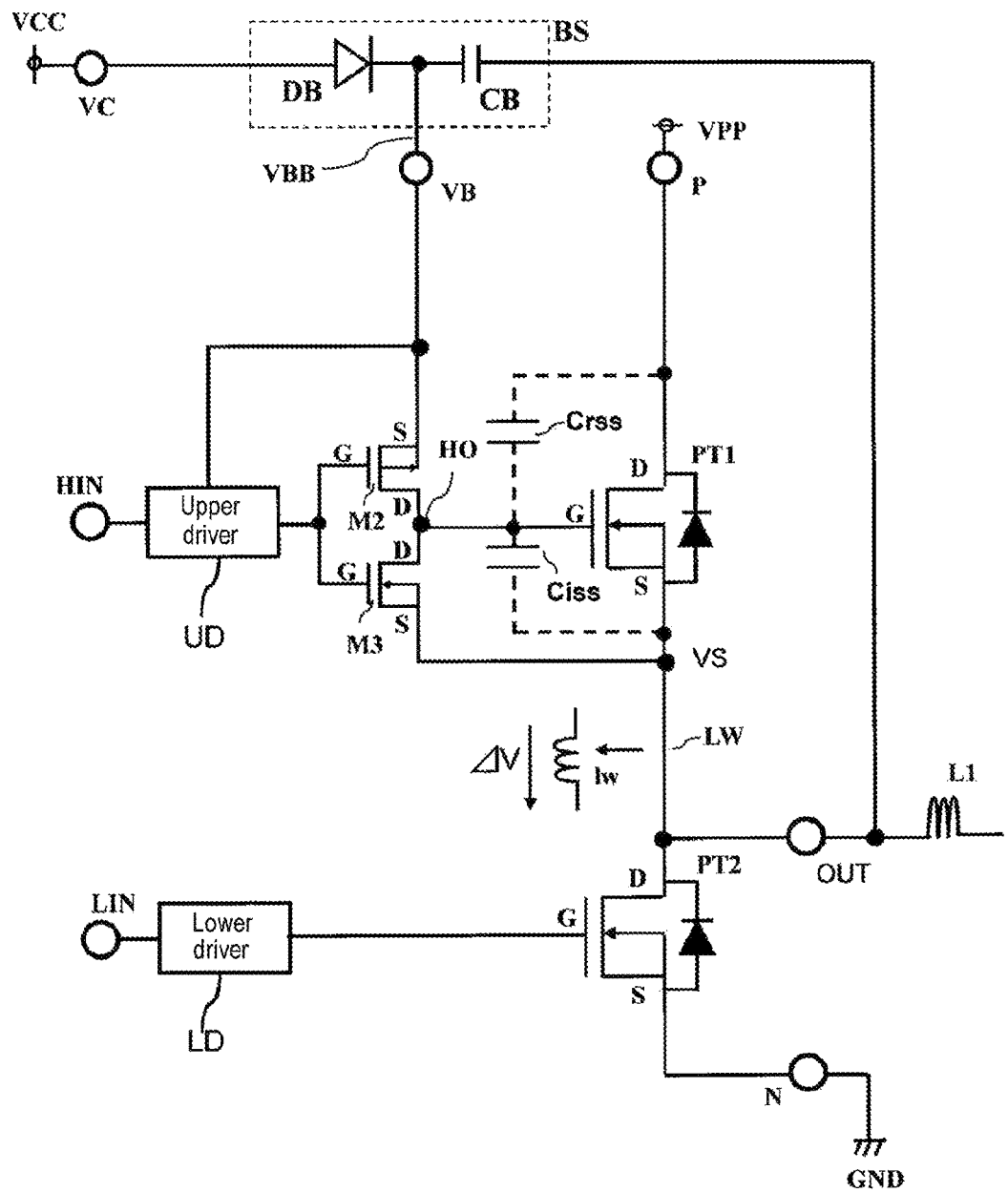
FIG. 11 is a circuit diagram showing a portion of a conventional power semiconductor drive circuit.

FIG. 10 shows results of comparison in driving loss between the power semiconductor drive circuit 10 according to the present disclosure shown in FIG. 5 and the conventional power semiconductor drive circuit 10 shown in FIG. 11 when these drive circuits are used for the power module circuit device 100A (IPM) shown in FIG. 9. The term "driving loss" used herein refers to power obtained by subtracting output power from input power. For example, if the input power is 1 [W] and the output power is 0.9 [W], the driving loss is 0.1 [W](=1−0.9). In FIG. 10, a horizontal axis represents comparison between the conventional technique and the present disclosure when an effective value (rms) of the output current id flowing in the transistor PT1 is 1 [A], 2 [A], and 4 [A]. A vertical axis represents normalized values of driving loss. Here, when the existing driving loss is assumed as 1.00, the driving loss in the present disclosure is numerically expressed. A smaller driving loss value represents higher output power for the input power, i.e., higher power efficiency. The driving loss is varied depending on a power supply voltage, an output current, a frequency of a driving signal, a control scheme and so on. This comparison is made under the conditions where the voltage VPP of the external terminal P as the second power supply terminal is 400V, the voltage VCC of the external terminal VC as the first power supply terminal is 15V, the frequency of the driving signal is 5 kHz, and the control scheme is a PWM three-phase modulation scheme.

When the effective values of the output current id are 1 [Arms], 2 [Arms], and 4 [Arms], the driving loss in the present disclosure is 0.70, 0.74, and 0.79, respectively. As the output current id increases, the ratio of the driving loss increases and the effect of reducing the driving loss is reduced slightly. However, it is found that the present disclosure saves the power consumption by more than 20% than the conventional technique.

According to the present disclosure in some embodiments, it is possible to prevent gate driver deterioration and breakdown due to internal inductance according to a high-voltage, large-current and high-speed switching, particularly at the time of transition from an ON state to an OFF state, prevent self-turning-on at the time of transition of an OFF state to an ON state, and reduce switching loss.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

INDUSTRIAL APPLICABILITY

As described above, the power semiconductor drive circuit, the power semiconductor circuit, and the power module circuit device of the present disclosure can prevent gate driver breakdown due to an inductance component according to a high-voltage, large-current, and high-speed switching, particularly at the time of transition from an ON state to an OFF state, prevent self-turning-on at the time of turning-ON/OFF of a power semiconductor element, and suppress increase in switching loss. Thus, the present disclosure has very high industrial applicability.

What is claimed is:

1. A power semiconductor drive circuit for driving an upper power semiconductor element and a lower power semiconductor element coupled in series between a power supply terminal and a ground electric potential, the circuit comprising:
   a parallel circuit having a first end which is directly connected to a gate of the upper power semiconductor element and a second end which is connected to a connection point between the upper power semiconductor element and the lower power semiconductor element, and constituted by at least two transistors for setting gate resistance of the upper power semiconductor element;
   a gate voltage monitoring circuit directly connected to the gate of the upper power semiconductor element and the parallel circuit, wherein a predetermined monitoring voltage is set in the gate voltage monitoring circuit in order to monitor a gate voltage of the upper power semiconductor element;
   a signal delay circuit to delay an output signal of the gate voltage monitoring circuit; and
   a gate control circuit to change a magnitude of combined resistance of the parallel circuit based on an output signal output from the signal delay circuit.

2. The power semiconductor drive circuit of claim 1, wherein the combined resistance of the parallel circuit is changed when the upper power semiconductor element is turned off.

3. The power semiconductor drive circuit of claim 2, wherein the monitoring voltage is equal to or less than a mirror voltage of the upper power semiconductor element.

4. The power semiconductor drive circuit of claim 3, wherein the combined resistance of the parallel circuit when the upper power semiconductor element is turned off is larger than the combined resistance of the parallel circuit when the upper power semiconductor element is in an OFF state.

5. The power semiconductor drive circuit of claim 4, wherein the combined resistance of the parallel circuit is changed after a delay time set in the signal delay circuit elapses.

6. The power semiconductor drive circuit of claim 5, wherein the gate voltage monitoring circuit is constituted by one or more selected from a group consisting of a Schmitt trigger, a hysteresis comparator, a window comparator, a comparator and an inverter.

7. The power semiconductor drive circuit of claim 1, wherein the signal delay circuit is an integration circuit including a resistor and a capacitor.

8. The power semiconductor drive circuit of claim 5, wherein a predetermined threshold voltage is set in the gate control circuit and wherein the gate control circuit outputs a result of a logical AND operation for a driving signal applied to the gate of the upper power semiconductor element and the output signal output from the signal delay circuit.

9. The power semiconductor drive circuit of claim 8, wherein assuming that a period from time t4, at which a mirror period of the gate voltage of the upper power semiconductor element is ended, to time t6, at which an output current flowing in the upper power semiconductor element is substantially zeroed, is $\tau 1$ and a period from time t5, at which the gate voltage becomes equal to the monitoring voltage, to time t8, at which the gate voltage becomes equal to the threshold voltage, is $\tau 2$, the condition of $\tau 2 > \tau 1$ is set.

10. The power semiconductor drive circuit of claim 8, wherein the upper power semiconductor element is complementary to the lower power semiconductor element, and
wherein assuming that a period from time t5, at which a gate voltage of the upper power semiconductor element becomes equal to the monitoring voltage, to time t8 at which the gate voltage of the upper power semiconductor element becomes equal to the threshold voltage, is $\tau 2$ and time t 10 is a time at which the gate voltage of the upper power semiconductor element when the lower power semiconductor element is in an ON state, becomes equal to the monitoring voltage, the relationship of $(t10-t5) > \tau 2$.

11. The power semiconductor drive circuit of claim 10, wherein assuming that a period from time t16, at which the gate voltage of the upper power semiconductor element becomes equal to the monitoring voltage, to time t20, at which the upper power semiconductor element begins to be turned off, is $\tau 3$ and a period from time t16, at which the gate voltage of the upper power semiconductor element becomes equal to the monitoring voltage, to time t18, at which the threshold voltage set in the gate control circuit becomes equal to a level of the output signal of the signal delay circuit, is $\tau 4$, the condition of $\tau 3 > \tau 4$ is set.

12. The power semiconductor drive circuit of claim 8, wherein the gate control circuit includes a first transistor, a second transistor, a logical AND circuit, a first node, a second node, and a third node,
wherein a gate of the first transistor and a first end of the logical AND circuit are connected to the first node,
wherein a drain of the first transistor, a drain of the second transistor, and a second end of the logical AND circuit are connected to the second node, wherein an output terminal of the logical AND circuit and a gate of the second transistor are connected to the third node, and
wherein the driving signal is applied to the first node and an output signal of the signal delay circuit is output to the second node.

13. A power semiconductor circuit comprising:
the power semiconductor drive circuit of claim 1; and
the upper power semiconductor element and the lower power semiconductor element, each of the upper power semiconductor element and the lower power semiconductor element having a gate driven by the power semiconductor drive circuit.

14. The power semiconductor circuit of claim 13, wherein each of the upper power semiconductor element and the lower power semiconductor element is a MOS transistor or IGBT.

15. The power semiconductor circuit of claim 14, wherein each of the upper power semiconductor element and the lower power semiconductor element is made of one selected from a group consisting of silicon (Si), silicon carbide (SiC), and gallium nitride (GaN).

16. The power semiconductor circuit of claim 15, wherein each of the upper power semiconductor element and the lower power semiconductor element further includes a diode, and
wherein the diode is made of one selected from a group consisting of silicon (Si), silicon carbide (SiC), and gallium nitride (GaN).

17. The power semiconductor circuit of claim 14, wherein the upper power semiconductor element and the lower power semiconductor element are fabricated on separate semiconductor substrates, and
wherein a drain-source conduction path of the upper power semiconductor element and a drain-source conduction path of the lower power semiconductor element are coupled in series between the power supply terminal and the ground electric potential.

18. The power semiconductor circuit of claim 14, wherein the power semiconductor circuit is used for one selected from a group consisting of inverters for converting DC into AC, one or more motor drive circuits, and switching power supply devices.

19. A power module circuit device comprising:
the power semiconductor circuit of claim 13; and
at least one electronic element constituting at least a bootstrap circuit.

20. The power module circuit device of claim 19, wherein the power module circuit device is packaged in a single dual-line package.

* * * * *